United States Patent
Pun

(10) Patent No.: US 12,272,660 B2
(45) Date of Patent: Apr. 8, 2025

(54) TRANSISTOR PACKAGES WITH IMPROVED DIE ATTACH

(71) Applicant: Wolfspeed, Inc., Durham, NC (US)

(72) Inventor: Arthur Pun, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/085,386

(22) Filed: Oct. 30, 2020

(65) Prior Publication Data
US 2022/0139852 A1 May 5, 2022

(51) Int. Cl.
| | | |
|---|---|---|
| *H01L 23/00* | (2006.01) | |
| *H01L 21/02* | (2006.01) | |
| *H01L 29/16* | (2006.01) | |
| *H01L 29/20* | (2006.01) | |

(52) U.S. Cl.
CPC ........ *H01L 24/05* (2013.01); *H01L 21/02518* (2013.01); *H01L 24/32* (2013.01); *H01L 29/1608* (2013.01); *H01L 29/2003* (2013.01); *H01L 2224/04026* (2013.01); *H01L 2224/0508* (2013.01); *H01L 2224/32503* (2013.01)

(58) Field of Classification Search
CPC ... H01L 24/05; H01L 21/02518; H01L 24/32; H01L 29/1608; H01L 29/2003; H01L 2224/04026; H01L 2224/0508; H01L 2224/32503
USPC ......................................................... 257/734
See application file for complete search history.

(56) References Cited

U.S. PATENT DOCUMENTS

| | | | |
|---|---|---|---|
| 4,946,547 | A | 8/1990 | Palmour et al. |
| 5,192,987 | A | 3/1993 | Khan et al. |
| 5,200,022 | A | 4/1993 | Kong et al. |
| 5,210,051 | A | 5/1993 | Carter, Jr. |
| 5,296,395 | A | 3/1994 | Khan et al. |
| 34,861 | A | 2/1995 | Davis et al. |
| 5,393,993 | A | 2/1995 | Edmond et al. |
| 5,523,589 | A | 6/1996 | Edmond et al. |
| 6,218,680 | B1 | 4/2001 | Carter, Jr. et al. |
| 6,316,793 | B1 | 11/2001 | Sheppard et al. |
| 6,548,333 | B2 | 4/2003 | Smith |
| 7,030,428 | B2 | 4/2006 | Saxler |

(Continued)

FOREIGN PATENT DOCUMENTS

| | | |
|---|---|---|
| JP | 2000353709 A | 12/2000 |
| JP | 2007123566 A | 5/2007 |

(Continued)

OTHER PUBLICATIONS

U.S. Appl. No. 17/018,762, filed Sep. 11, 2020, including official Filing Receipt.

(Continued)

*Primary Examiner* — Nduka E Ojeh
*Assistant Examiner* — Laura M Dykes
(74) *Attorney, Agent, or Firm* — Myers Bigel, P.A.

(57) ABSTRACT

A transistor device structure may include a submount, a transistor device on the carrier submount, and a metal bonding layer between the submount and the transistor die, the metal bonding stack providing mechanical attachment of the transistor die to the submount. The metal bonding stack may include gold, tin and nickel. A weight percentage of a combination of nickel and tin in the metal bonding layer is greater than 50 percent and a weight percentage of gold in the metal bonding layer is less than 25 percent.

23 Claims, 10 Drawing Sheets

(56) References Cited

U.S. PATENT DOCUMENTS

| | | | |
|---|---|---|---|
| 7,544,963 B2 | 6/2009 | Saxler | |
| 7,548,112 B2 | 6/2009 | Sheppard | |
| 7,592,211 B2 | 9/2009 | Sheppard et al. | |
| 7,615,774 B2 | 11/2009 | Saxler | |
| 7,709,269 B2 | 5/2010 | Smith et al. | |
| 7,910,945 B2 | 3/2011 | Donofrio et al. | |
| 8,643,195 B2 | 2/2014 | Slater, Jr. et al. | |
| 2007/0045765 A1 | 3/2007 | Brar et al. | |
| 2011/0084341 A1* | 4/2011 | Kosaka | H01L 24/05 |
| | | | 257/E27.062 |
| 2012/0211793 A1* | 8/2012 | Bergmann | H01L 33/40 |
| | | | 257/E33.066 |
| 2016/0056273 A1* | 2/2016 | Senda | H01L 23/481 |
| | | | 257/194 |

FOREIGN PATENT DOCUMENTS

| | | |
|---|---|---|
| JP | 2016046306 A | 4/2016 |
| JP | 2018144082 A | 9/2018 |
| JP | 2019110280 A | 7/2019 |
| TW | 202042314 A * | 11/2020 |

OTHER PUBLICATIONS

U.S. Appl. No. 17/018,721, filed Sep. 11, 2020, including official Filing Receipt.
Notification of Transmittal of the International Search Report and the Written Opinion of the International Searching Authority, or the Declaration, in corresponding PCT Application No. PCT/US2021/056598 (Mar. 7, 2022).

* cited by examiner

TRANSISTOR PACKAGES WITH IMPROVED DIE ATTACH

FIELD

The present disclosure relates to microelectronic devices and, more particularly, to high power, high frequency transistors and related device packages.

BACKGROUND

Electrical circuits requiring high power handling capability and/or operating at high frequencies, such as R-band (0.5-1 GHz), S-band (3 GHz) and X-band (10 GHz), have in recent years become more prevalent. In particular, there may be high demand for radio frequency (RF) transistor amplifiers that are used to amplify RF signals at radio (including microwave) frequencies. These RF transistor amplifiers may need to exhibit high reliability, good linearity and handle high output power levels. Even beyond the RF domain, other types of transistor devices, including direct current (DC) biased transistor amplifiers and high-power transistor switch, may need to handle high output power levels.

Transistor devices may be implemented in silicon or using wide bandgap semiconductor materials (i.e., having a bandgap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based transistor devices are typically implemented using laterally diffused metal oxide semiconductor ("LDMOS") transistors. Silicon LDMOS transistor devices can exhibit high levels of linearity and may be relatively inexpensive to fabricate. Group III nitride-based transistor devices are typically implemented using High Electron Mobility Transistors ("HEMT") and are primarily used in applications requiring high power and/or high frequency operation where LDMOS transistor devices may have inherent performance limitations.

Transistor amplifiers may include one or more amplification stages, with each stage typically implemented as a transistor amplifier. In order to increase the output power and current handling capabilities, transistor amplifiers are typically implemented in a "unit cell" configuration in which a large number of individual "unit cell" transistors are arranged electrically in parallel. A transistor amplifier may be implemented as a single integrated circuit chip or "die," or may include a plurality of dies. A die or chip may refer to a small block of semiconducting material or other substrate on which electronic circuit elements are fabricated. When multiple transistor amplifier die are used, they may be connected in series and/or in parallel.

Transistor amplifiers often include matching circuits, such as impedance matching circuits that are designed to improve the impedance match between the active transistor die (e.g., including MOSFETs, HEMTs, LDMOS, etc.) and transmission lines connected thereto for signals at the fundamental operating frequency, and harmonic termination circuits that are designed to at least partly terminate harmonics that may be generated during device operation, such as second and third order harmonics. Termination of harmonics also influences generation of intermodulation distortion products.

The transistor amplifier die(s) as well as the impedance matching and/or harmonic termination circuits may be enclosed in an integrated circuit device package. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. The package typically includes an attachment surface or "submount" on which the dies are mounted, an electrically insulating encapsulant material, such as plastic or ceramic, that seals and protects the dies from moisture and dust particles. Electrically conductive leads (also referred to herein as package leads) may extend from the package, and are used to electrically connect the transistor amplifier to external circuit elements such as input and output transmission lines and bias voltage sources.

As noted above, Group III nitride-based transistor amplifiers are often used in high power and/or high frequency applications. Typically, high levels of heat are generated within the Group III nitride-based amplifier die(s) during operation. If the transistor amplifier die(s) become too hot, the performance (e.g., output power, efficiency, linearity, gain, etc.) of the transistor amplifier may deteriorate and/or the transistor amplifier die(s) may be damaged. As such, Group III nitride-based transistor amplifiers are typically mounted in packages that may be optimized for heat removal.

In some package designs, the submount of the package includes a thermally conductive substrate, which may also be referred to as a "heat slug" or "heat sink." A package level heat slug is designed to pull heat away from the integrated circuits and toward an external heat sink. Typically, the heat slug is formed from a thermally conductive material (e.g., metal). In some package configurations, the heat slug also serves as an electrical terminal that provides a reference potential (e.g., ground) to the dies that are mounted thereon. For example, the submount may be a CPC (copper, copper-molybdenum, copper laminate structure) or copper flange that provides both an attachment surface for the dies and a heat slug.

One semiconductor package design is an "open air-cavity" or "open-cavity" package, in which a (typically ceramic) lid is placed over a metal heat slug. The ceramic lid seals an open-air cavity that includes the transistor amplifier dies and/or other integrated circuits and associated electrical connections. The package leads of the open air-cavity ceramic package may be attached to the heat slug using a high temperature brazing process.

Another semiconductor package design is a molded design (or "overmold" package), in which a plastic or other non-conductive material is molded (e.g., by injection or transfer molding) directly on to the heat slug to form a solid structure that directly contacts and encapsulates the transistor amplifier dies and/or other integrated circuits and associated electrical connections as well as the heat slug. The package leads of a molded plastic package may be attached to the heat slug using a lead frame, in which an outer frame that includes the package leads is placed around the heat slug. After die attach and wire bonding, the plastic encapsulant material is molded around the heat slug and the package leads.

SUMMARY

According to some embodiments of the present disclosure, a transistor device structure includes a transistor die on the submount and a metal bonding layer between the submount and the transistor die, the metal bonding stack providing mechanical attachment of the transistor die to the submount. The metal bonding layer comprises gold, tin and nickel, and wherein a weight percentage of a combination of nickel and tin in the metal bonding layer is greater than 50 percent and a weight percentage of gold in the metal bonding layer is less than 25 percent.

In some embodiments, the weight percentage of gold in the metal bonding layer is less than 10 percent.

In some embodiments, the weight percentage of gold in the metal bonding layer is less than 5 percent.

In some embodiments, the metal bonding layer further comprises a barrier layer between a portion of the metal bonding layer comprising tin and the transistor die.

In some embodiments, the barrier layer comprises platinum.

In some embodiments, the metal bonding layer is between the submount and the transistor die in a first direction, and a longest dimension of the metal bonding layer in a second direction that is perpendicular to the first direction exceeds 3.5 mm.

In some embodiments, the transistor device structure further includes a substrate contact layer between the metal bonding layer and the transistor die.

In some embodiments, the substrate contact layer comprises a gold layer having a thickness between 2 μm and 8 μm.

In some embodiments, the transistor die comprises a substrate, a channel layer on the substrate, a barrier layer on the channel layer, and a via penetrating the substrate, the channel layer, and the barrier layer. A first portion of the metal bonding layer is between the substrate and the submount, and a second portion of the metal bonding layer is on a sidewall of the via.

In some embodiments, a composition of the first portion of the metal bonding layer is different than a composition of the second portion of the metal bonding layer.

In some embodiments, the substrate comprises silicon carbide.

In some embodiments, the transistor die comprises a gate terminal and a drain terminal, and the metal bonding layer electrically connects the gate terminal to the submount.

In some embodiments, an operating frequency of the transistor device structure is between 500 MHz and 75 GHz.

In some embodiments, a power output of the transistor device structure is between 50 W and 200 W.

According to some embodiments of the present disclosure, a transistor device structure includes a submount, a transistor die on the submount, and a metal bonding layer between the submount and the transistor die in a first direction, the metal bonding layer providing mechanical attachment of the transistor die to the submount. A composition of the metal bonding layer predominately comprises nickel and tin, and a longest dimension of the metal bonding layer exceeds 3.5 mm in a second direction that is perpendicular to the first direction.

In some embodiments, a weight percentage of a combination of nickel and tin in the metal bonding layer is greater than 50 percent.

In some embodiments, the metal bonding layer further comprises gold, and a weight percentage of gold in the metal bonding layer is less than 10 percent.

In some embodiments, the metal bonding layer further comprises a barrier layer between a tin portion of the metal bonding layer and the transistor die.

In some embodiments, the barrier layer comprises platinum.

In some embodiments, the transistor device structure further includes.

In some embodiments, a contact layer between the submount and the metal bonding layer.

In some embodiments, the contact layer comprises a gold layer having a thickness between 2 μm and 8 μm.

In some embodiments, the transistor die includes a substrate, a channel layer on the substrate, a barrier layer on the channel layer, and a via penetrating the substrate, the channel layer, and the barrier layer. A first portion of the metal bonding layer is between the substrate and the submount, and a second portion of the metal bonding layer is on a sidewall of the via.

In some embodiments, a composition of the first portion of the metal bonding layer is different than a composition of the second portion of the metal bonding layer.

In some embodiments, an operating frequency of the transistor device structure is between 500 MHz and 75 GHz.

According to some embodiments of the present disclosure, a transistor device structure includes a transistor die comprising a semiconductor structure including a semiconductor substrate, a barrier layer and a channel layer, a source contact on the semiconductor structure, a via penetrating the semiconductor substrate, the barrier layer, and the channel layer to be electrically coupled to the source contact, a metal bonding layer, the metal bonding layer comprising a first portion within the via, and a submount on the metal bonding layer. The metal bonding layer comprises an alloy of tin and nickel.

In some embodiments, the metal bonding layer further comprises gold, and wherein a weight percentage of a combination of nickel and tin in the metal bonding layer is greater than about 50 percent and a weight percentage of gold in the metal bonding layer is less than about 25 percent.

In some embodiments, the metal bonding layer further comprises a second portion that is outside the via and between the semiconductor substrate and the submount.

In some embodiments, a composition of the first portion of the metal bonding layer is different than a composition of the second portion of the metal bonding layer.

In some embodiments, the first portion of the metal bonding layer is disposed at a same level as a portion of the channel layer.

In some embodiments, the metal bonding layer further comprises a barrier layer between a tin portion of the metal bonding layer and the transistor die.

In some embodiments, the barrier layer comprises platinum.

In some embodiments, the metal bonding layer is separated from the transistor die in a first direction, and a longest dimension of the metal bonding layer in a second direction that is perpendicular to the first direction exceeds 3.5 mm.

In some embodiments, an operating frequency of the transistor device structure is between 500 MHz and 75 GHz.

According to some embodiments of the present disclosure, a method of forming a transistor device structure includes providing a submount, forming a metal bonding stack on a transistor die, placing the transistor die with the metal bonding stack on the submount such that the metal bonding stack is between the transistor die and the submount, and applying heat and/or pressure to the transistor die and the metal bonding stack to provide mechanical attachment of the transistor die to the submount. The metal bonding stack comprises a layer of tin adjacent a layer of nickel.

In some embodiments, the metal bonding stack further comprises gold, and wherein a weight percentage of a combination of the nickel and the tin in the metal bonding stack is greater than 50 percent and a weight percentage of gold in the metal bonding stack is less than 25 percent.

In some embodiments, the weight percentage of gold in the metal bonding stack is less than 10 percent.

In some embodiments, the metal bonding stack further comprises a barrier layer between the layer of tin of the metal bonding stack and the transistor die.

In some embodiments, the barrier layer comprises platinum.

In some embodiments, the metal bonding stack is stacked on the transistor die in a first direction, and.

In some embodiments, a longest dimension of the metal bonding stack in a second direction that is perpendicular to the first direction exceeds 3.5 mm.

In some embodiments, the method further includes forming a substrate contact layer on the transistor die, and the metal bonding stack is formed on the substrate contact layer.

In some embodiments, the substrate contact layer comprises a gold layer having a thickness between 2 μm and 8 μm.

In some embodiments, the transistor die includes a substrate, a channel layer on the substrate, and a barrier layer on the channel layer. The method further includes forming a via that penetrates the substrate, the channel layer, and the barrier layer, and forming the metal bonding stack on the transistor die includes forming a first portion of the metal bonding stack on a bottom surface of the substrate and a second portion of the metal bonding stack on a sidewall of the via.

In some embodiments, the substrate comprises silicon carbide.

In some embodiments, the method further includes patterning the metal bonding stack into a plurality of portions.

In some embodiments, the method further includes placing the transistor die with the metal bonding stack on the submount such the plurality of portions of the metal bonding stack are respectively between a plurality of terminals of the transistor die and the submount.

In some embodiments, an operating frequency of the transistor device structure is between 500 MHz and 75 GHz.

In some embodiments, a power output of the transistor device structure is between 50 W and 200 W.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION OF EMBODIMENTS

Figure 1A:
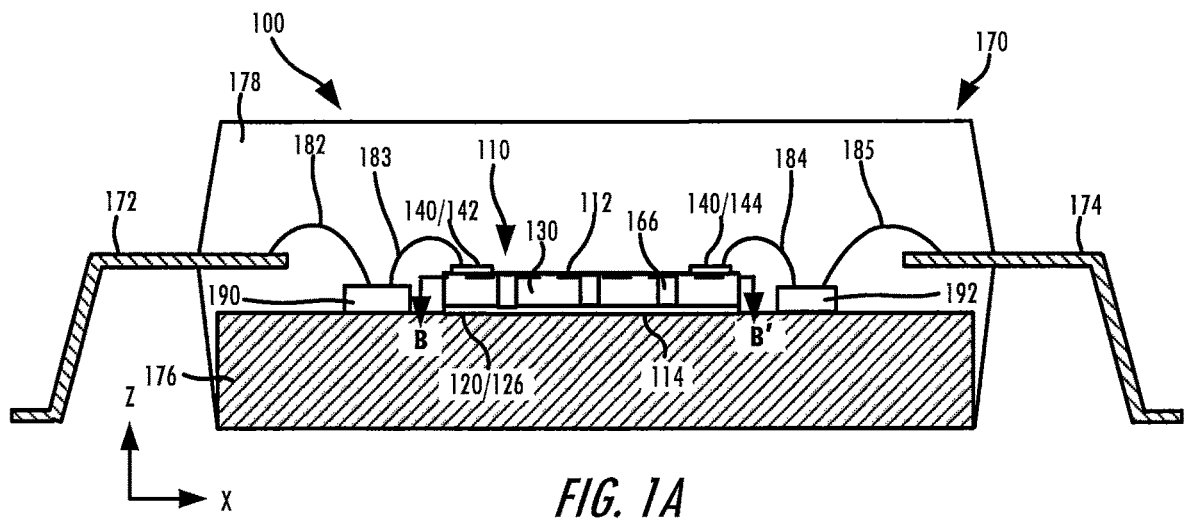
FIG. 1A is a schematic side view of a packaged Group III nitride-based transistor amplifier in accordance with various embodiments of the present disclosure.

The previous manner of joining a transistor die to a submount includes the use of various metal layers in a manner either identical or analogous to soldering or brazing. In many circumstances, a layer of titanium (Ti) is formed or deposited onto the respective surfaces to be joined, and then additional layers of bonding metals are added to form the bonding metal structure on the first and/or second substrates, that comprise the respective surfaces to be joined, (sometimes referred to as the donor and acceptor substrates).

For numerous reasons, gold (Au) has historically been a predominant element in these bonding metal layers. Because it resists oxidation and other chemical reactions, gold also is attractive for its corrosion resistance; i.e., avoiding undesired reaction with its surroundings. The ability of gold to form relatively low melting point alloys or compounds (with respect to pure gold), makes it desirable for soldering purposes.

Nevertheless, the expense of gold, even the very small amounts used in individual semiconductor devices, becomes significant when multiplied over millions of individual transistor devices. As used herein "transistor devices" includes both power transistor switching devices and transistor amplifier devices, including transistor amplifier devices operating in the RF domain. As another factor, soldering wafers to one another requires some application of heat. Thus, a soldering step used to join a transistor die to a submount will heat the transistor die to some extent. As is well understood by those of ordinary skill in the art, the probability of generation of defects in the semiconductor epitaxial layers increases as a temperature of the epitaxial layers increases. Typically, gold-tin based soldering (bonding, brazing) systems require temperatures above about 300° C. Although epitaxial layers of, for example, Group III nitride materials can theoretically withstand such temperatures, in practice these temperatures significantly increase the probability that the bonding step will generate noticeable defects.

As yet an additional factor, when individual transistor dies are separated from a wafer and mounted within a package (e.g., package 170 of FIG. 1A), they are typically subjected to other soldering and/or bonding operations. Thus, the temperature at which these additional soldering and/or bonding operations can be performed will be limited by the temperature that the die-submount bond can withstand without melting. Stated differently, the thermal characteristics of the die-submount bonding metallurgy may unfavorably limit the type of soldering and/or bonding operations that can be performed.

Similarly, as noted above, transistor devices are often used in high power and/or high frequency applications that generate high levels of heat during operation. For example, GaN-based amplifiers may operate with junction temperatures in the 250-275° C. range. In some embodiments, power transistor dies may have output power greater than 50 W (e.g., between 50 W and 200 W), which may generate similar temperatures. Because this temperature can approach the remelting temperature of some bonding systems, the die-submount bond can be negatively impacted by the use of certain types of metal, such as AuSn, as the metal bonding system.

In some cases, alternatives to the use of gold-tin have been developed. As an example, transistor devices may use sintered silver as a die-attach material to avoid some of the disadvantages of gold-tin. Sintered silver is a porous silver material that bonds a semiconductor die to the substrate as part of the packaging process. However, characteristics of the sintered silver material may limit its ability to be used during wafer-level processing, instead being used primarily during package-level processing. This can increase the complexity of its use during the manufacturing process of the transistor device.

In order to simulate the capability of a transistor device to withstand the operating environment that may be encountered, transistor devices are often subjected to thermal shock and thermal cycling tests. In a thermal shock test, the transistor device is rapidly subjected to a large temperature shift. In a thermal cycling test, the transistor device is cycled repeated between high and low temperatures. These tests have shown that the vulnerability of a particular transistor device (e.g., a transistor amplifier and/or transistor switch) may depend on the longest dimension (e.g., a diagonal, a length, or a width) of the transistor device. Transistor devices may be larger than other devices, such as light emitting devices, and may have longest dimensions exceeding 3.5 mm. Thus, the large size of the transistor devices, coupled with the high temperatures of the transistor device during operation can make the transistor device particular vulnerable to the types of materials used in the metal bonding system.

The embodiments herein describe a metal bonding stack of a metal bonding system that is predominately nickel and tin. The use of nickel and tin provided as the metal bonding stack allows for the creation of a nickel-tin alloy at relatively low temperatures that has a higher remelting temperature than prior metal bonding systems used in previous transistor devices. By reducing the Au content of the bonding stack, the impact to the die-submount bond from higher operating temperatures can be reduced, while also reducing a cost of the overall stack.

Figure 1B:
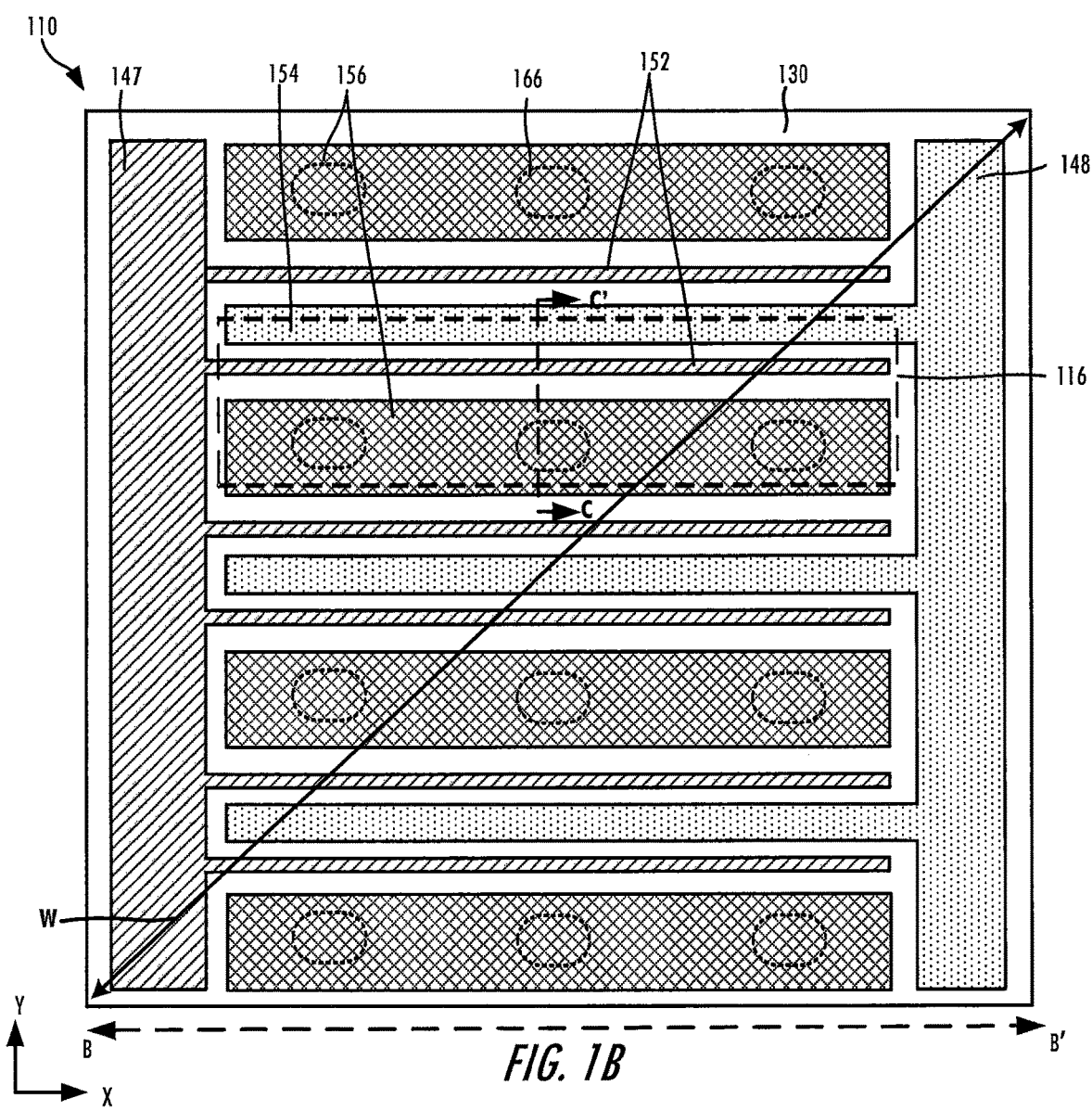
FIG. 1B is a schematic horizontal cross-sectional view of a transistor amplifier die in accordance with various embodiments of the present disclosure, where the cross-section is taken along line B-B' of FIG. 1A.
Figure 1C:
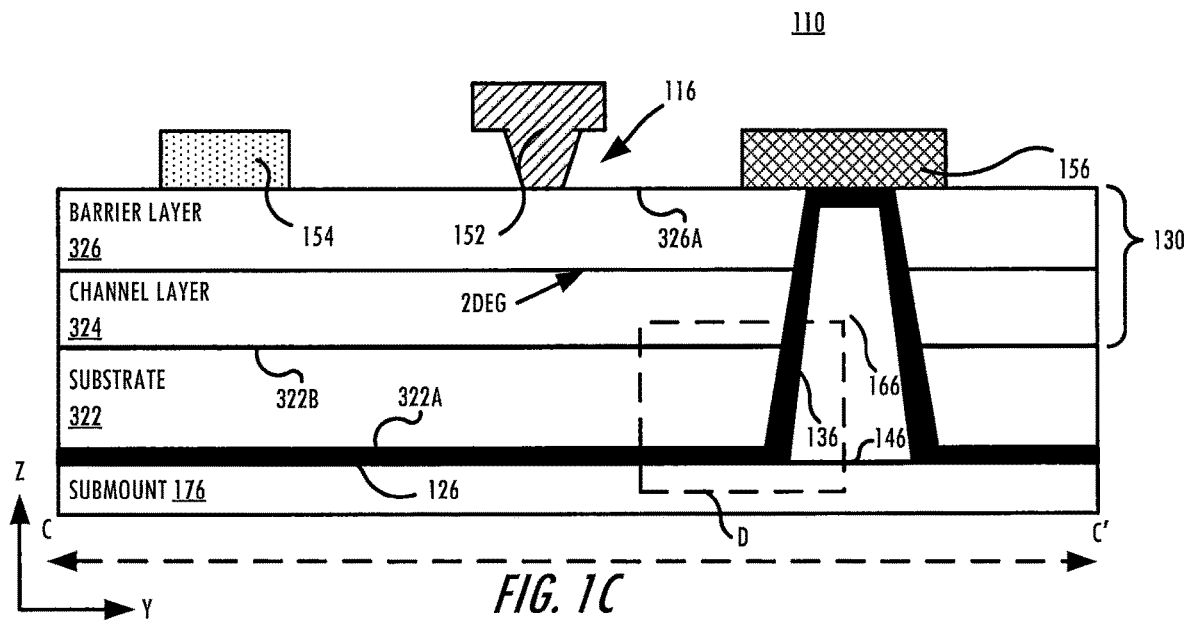
FIG. 1C is a schematic cross-sectional view of a transistor amplifier die unit cell in accordance with various embodiments of the present disclosure, where the cross-section is taken along line C-C' of FIG. 1B.
Figure 1D:
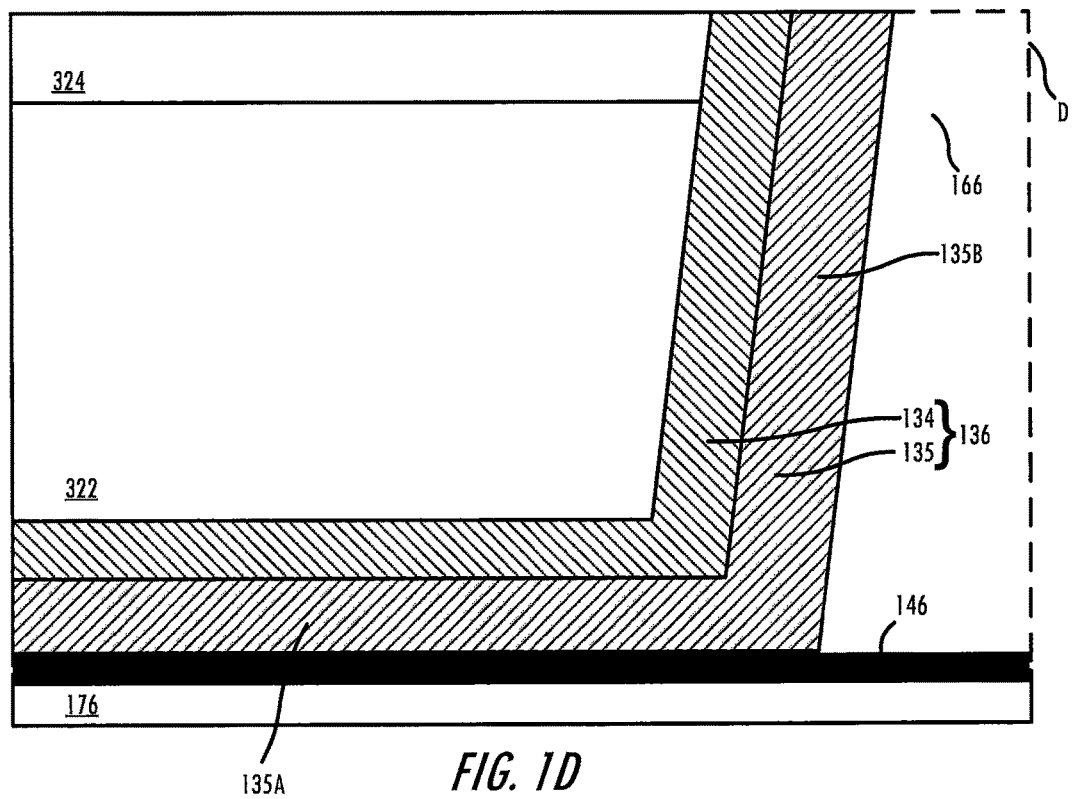
FIG. 1D is a schematic cross-section showing detail of an area D of FIG. 1C.

FIGS. 1A and 1B illustrate a packaged Group III nitride-based transistor device. In particular, FIG. 1A is a schematic side view of a packaged Group III nitride-based transistor device 100, and FIG. 1B is a schematic horizontal cross-sectional view of a transistor die 110 that is included in the packaged Group III nitride-based transistor device 100, where the cross-section is taken along line B-B' of FIG. 1A. FIG. 1C is a schematic cross-sectional view of a unit cell 116 of the transistor die 110, where the cross-section is taken along line C-C' of FIG. 1B. FIG. 1D is a schematic cross-section showing detail of an area D of FIG. 1C. In some embodiments, the packaged Group III nitride-based transistor device 100 is a transistor amplifier, and in some embodiments may be configured to operate in the RF domain. However, the present disclosure is not limited thereto. It will be understood that the embodiments of the present invention may be utilized with other transistor devices, including power switching devices. It will be appreciated that FIGS. 1A-1D (and various of the other figures) are highly simplified diagrams and that actual transistor devices may include many more unit cells and various circuitry and elements that are not shown in the simplified figures herein. More generally, the figures herein are intended to represent structures for identification and description and are not intended to represent the structures to physical scale.

As shown in FIG. 1A, the Group III nitride-based transistor device 100 includes a transistor die 110 that is mounted within a package 170, also referred to herein as a packaged transistor device. In some embodiments, the transistor device 100 may be an RF transistor amplifier device 100 configured to operate with input signals in the RF range, but the embodiments of the present disclosure are not limited thereto. The package 170 includes a submount (also referred to herein as a base or flange) 176 including one or more electrically conductive package leads thereon, for example, one or more input (e.g., gate) leads 172 and one or more output (e.g., drain) leads 174. The transistor die 110 is mounted on the upper surface of the submount 176. The submount 176 may be or may include an electrically conductive attachment surface, for example, a metal substrate (or "slug") that acts as a thermally conductive heat sink. In some embodiments, the submount 176 may additionally or alternatively include a redistribution layer (RDL) laminate structure including conductive layers fabricated using semiconductor processing techniques; a printed circuit board with metal traces; and/or a ceramic substrate that includes electrically conductive vias and/or pads. In some embodiments, a metal lead frame may be formed and then processed to provide the metal submount 176 and/or the package leads (e.g., gate and drain leads) 172 and 174. Transistor device 100 also includes housing 178 (e.g., a plastic overmold) that at least partially surrounds the transistor die 110, the package leads 172, 174 and the metal submount 176.

The transistor die 110 has a top side 112 and a bottom side 114. The transistor die 110 includes a bottom side (also referred to as a "back" side) metallization structure 120, a semiconductor layer structure 130 and a top side metallization structure 140 that are sequentially stacked. The back side metallization structure 120 includes a metal source terminal 126. The transistor device 100 may be a HEMT-based transistor device, in which case the semiconductor layer structure 130 may include at least a channel layer 324 and a barrier layer 326, which are typically formed on a substrate 322 (see FIG. 1C, discussed in detail below). The substrate 322 may be a semiconductor or insulating growth substrate (such as a SiC or sapphire substrate). The growth substrate, even if formed of a non-semiconductor material, may be considered to be part of the semiconductor layer structure 130. Herein, the term "semiconductor layer structure" refers to a structure that includes one or more semiconductor layers, for example, semiconductor substrates and/or semiconductor epitaxial layers. The top side metallization structure 140 includes, among other things, a metal gate terminal 142 and a metal drain terminal 144.

Input matching circuits 190 and/or output matching circuits 192 may also be mounted within the package 170. The matching circuits 190, 192 may be impedance matching circuits that match the impedance of the fundamental component of signals input to or output from the transistor device 100 to the impedance at the input or output of the transistor die 110, respectively, and/or harmonic termination circuits that are configured to short to ground harmonics of the fundamental frequencies of the signals that may be present at the input or output of the transistor die 110, such as second order or third order harmonics. As schematically shown in FIG. 1A, the input and output matching circuits 190, 192 may be mounted on the metal submount 176. The gate lead 172 may be connected to the input matching circuit 190 by one or more first bond wires 182, and the input matching circuit 190 may be connected to the gate terminal 142 of the transistor die 110 by one or more second bond wires 183. Similarly, the drain lead 174 may be connected to the output matching circuit 192 by one or more fourth bond wires 185, and the output matching circuit 192 may be connected to the drain terminal 144 of the transistor die 110 by one or more third bond wires 184. The source terminal 126 of the transistor die 110 may be mounted directly on the metal submount 176. The metal submount 176 may provide the electrical connection to the source terminal 126 and may also serve as a heat dissipation structure. The first through fourth bond wires 182-185 may form part of the input and/or output matching circuits. The gate lead 172 and the drain lead 174 may extend through the housing 178.

Figure 1E:
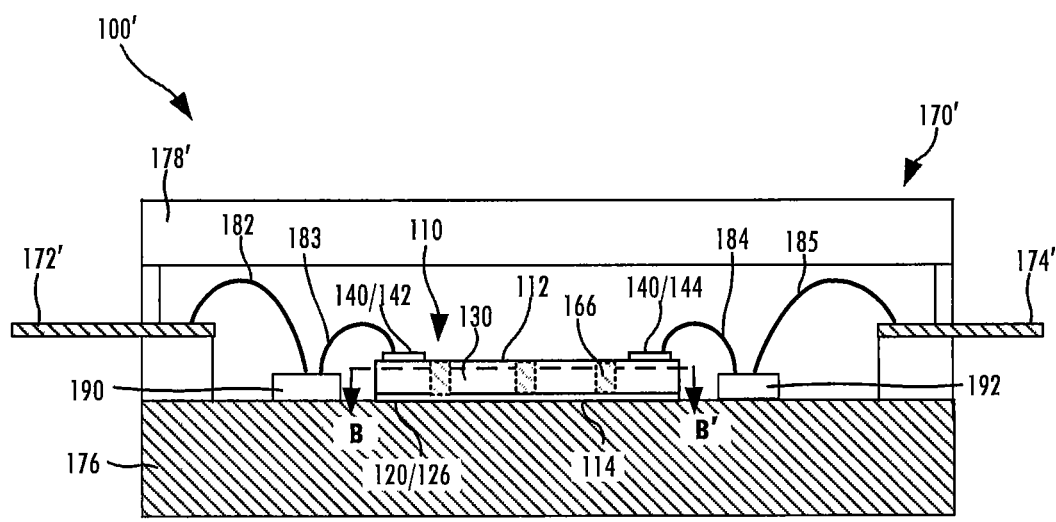
FIG. 1E is a schematic side view of another packaged Group III nitride-based transistor amplifier in accordance with various embodiments of the present disclosure.

While FIG. 1A illustrates a package 170 incorporating a plastic overmold 178, the embodiments of the present disclosure are not limited to such a package configuration. FIG. 1E is a schematic side view of another example of a packaged Group III nitride-based transistor device 100' that is similar to the transistor device 100 discussed above with reference to FIG. 1A. Transistor device 100' differs from transistor device 100 of FIG. 1A in that it includes a different package 170'. The package 170' includes the metal submount 176 (which acts as a metal heat sink and can be implemented as a metal slug), as well as gate and drain leads 172', 174'. In some embodiments, a metal lead frame may be formed that is then processed to provide the metal submount 176 and/or the gate and drain leads 172', 174'. Transistor device 100' also includes a housing 178' that at least partially surrounds the transistor die 110, the leads 172', 174' and the metal submount 176. The housing 178' may comprise a ceramic housing in some embodiments, and the gate lead 172' and the drain lead 174' may extend through the housing 178'. In some embodiments, the housing 178' may comprise plastic and/or a printed circuit board. The housing 178' may comprise multiple pieces, such as a frame that forms the lower portion of the sidewalls and supports the gate and drain leads 172', 174', and a lid that is placed on top of the frame. The interior of the device may comprise an air-filled cavity. The sidewalls and lid of the housing 178' of FIG. 1E replace the plastic overmold 178 included in transistor device 100 illustrated in FIG. 1A.

The arrangement in FIGS. 1A and 1E of the transistor die 110, the input matching circuit 190, and the output matching circuit 192, including the bond wire arrangement, are merely examples and not intended to limit the present disclosure. Depending on the embodiment, the packaged transistor device 100 can include, for example, a monolithic microwave integrated circuit (MMIC) as the transistor die 110 in which case the transistor die 110 incorporates multiple discrete devices. When the transistor die 110 is a MMIC implementation, the input matching circuits 190 and/or the output matching circuits 192 may be omitted (since they may instead be implemented within the transistor die 110) and the bond wires 182 and/or 185 may extend directly from the gate and drain leads 172, 174 to the gate and drain terminals 142, 144. In some embodiments, the packaged transistor device 100, 100' can include multiple transistor dies that are connected in series to form a multiple stage transistor device and/or may include multiple transistor dies that are disposed in multiple amplifier paths (e.g., in parallel) to form a transistor device with multiple transistor dies and multiple paths, such as in a dual-path driver amplifier and/or a Doherty amplifier configuration.

In some embodiments, the input matching circuit 190 and/or the output matching circuit 192 may be omitted. In some embodiments, the bonding wires 182 to 185 may be omitted. For example, in some embodiments, the input matching circuit 190 and/or the output matching circuits 192 may be incorporated using an interconnect circuit and/or circuitry module such as those described in U.S. patent application Ser. No. 17/018,762, filed Sep. 11, 2020, entitled "RF AMPLIFIER DEVICES AND METHODS OF MANUFACTURING" and U.S. patent application Ser. No. 17/018, 721, filed Sep. 11, 2020, entitled "PACKAGING FOR RF TRANSISTOR AMPLIFIERS," the contents of which are incorporated herein by reference in their entirety.

FIG. 1B is a schematic horizontal cross-sectional view of the transistor die 110 that is taken through a portion of the top side metallization structure 140. Dielectric layers that isolate the various conductive elements of the top-side metallization structure 140 from each other are not shown in FIG. 1B to simplify the drawing.

As shown in FIG. 1B, the transistor die 110 is illustrated by way of example as a Group III nitride-based HEMT transistor device that has a plurality of unit cell transistors 116 that each include a gate finger 152, a drain finger 154 and a source finger 156. It will be appreciated, however, that the transistor dies 110 may be implemented in a different technology such as, for example, a silicon LDMOS transistor. The gate fingers 152 are electrically connected to a common gate bus 147, and the drain fingers 154 are electrically connected to a common drain bus 148. The gate bus 147 is electrically connected to the gate terminal 142 (e.g., through deposited conductive material such as a metal) which is implemented as a gate bond pad (see FIG. 1A), and the drain bus 148 is electrically connected to the drain terminal 144 (e.g., through deposited conductive material such as a metal) which is implemented as a drain bond pad (see FIG. 1A). The source fingers 156 are electrically connected to the source terminal 126 via a plurality of conductive source vias 166 that extend through the semiconductor layer structure 130. The conductive source vias 166 may be metal-plated vias that extend completely through the semiconductor layer structure 130. The number of gate fingers 152, drain fingers 154, and source fingers 156 that are illustrated in FIG. 1B are merely examples, and the total number of gate fingers 152, drain fingers 154, and source fingers 156 present in the transistor die 110 may be more or fewer than the number illustrated in FIG. 1B.

Due to the number of unit cell transistors 116 incorporated into the transistor die 110, the transistor die 110 may have a longest dimension W. In FIG. 1B, the longest dimension W is illustrated as being in a diagonal direction (e.g., from a first lower left corner to a second upper right corner, in plan view), but the present disclosure is not limited thereto. In some embodiments, the longest dimension W of the transistor die 110 may exceed 3.5 mm. In some embodiments, the longest dimension W of the transistor die 110 may exceed 5 mm. In some embodiments, the longest dimension W of the transistor device may be between 4 mm and 10 mm. Because the longest dimension of the transistor die 110 may be larger than those of other types of devices, the materials used to bond the transistor die 110 to the submount 176 may be particularly vulnerable to rapid temperature variations, such as those that are present in thermal shock/thermal cycling operations.

Referring to FIG. 1C, the semiconductor layer structure 130, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc. The term "semi-insulating" is used descriptively herein, rather than in an absolute sense.

In some embodiments of the present invention, the silicon carbide bulk crystal of the substrate 322 may have a resistivity equal to or higher than about $1\times10^5$ ohm-cm at room temperature. Exemplary SiC substrates that may be used in some embodiments of the present invention are manufactured by, for example, Cree, Inc., of Durham, N.C., the assignee of the present invention, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a silicon carbide wafer, and the transistor die 110 may be formed, at least in part, via wafer-level processing, and the wafer may then be diced to provide a plurality of transistor die 110.

The substrate 322 may have a lower surface 322A and an upper surface 322B. In some embodiments, the substrate 322 of the transistor die 110 may be a thinned substrate 322. In some embodiments, the thickness of the substrate 322 (e.g., in a vertical Z direction in FIG. 1C) may be 150 μm or less. In some embodiments, the thickness of the substrate 322 may be 100 μm or less. In some embodiments, the thickness of the substrate 322 may be 75 μm or less. In some embodiments, the thickness of the substrate 322 may be 50 μm or less.

A channel layer 324 is formed on the upper surface 322B of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial growth of Group III nitrides have been described in, for example, U.S. Pat. Nos. 5,210,051, 5,393,993, and 5,523, 589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials.

In some embodiments, the channel layer 324 may be a Group III nitride, such as $Al_xGa_{1-x}N$, where $0\leq x<1$, provided that the energy of the conduction band edge of the channel layer 324 is less than the energy of the conduction band edge of the barrier layer 326 at the interface between the channel and barrier layers 324, 326. In certain embodiments of the present invention, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 μm. The channel layer 324 may also be a multi-layer structure, such as a superlattice or combinations of GaN, AlGaN or the like. The channel layer 324 may be under compressive strain in some embodiments.

In some embodiments, the barrier layer 326 is AlN, AlInN, AlGaN or AlInGaN or combinations of layers thereof. The barrier layer 326 may comprise a single layer or may be a multi-layer structure. In particular embodiments of the present invention, the barrier layer 326 may be thick enough and may have a high enough aluminum (Al) composition and doping to induce a significant carrier concentration at the interface between the channel layer 324 and the barrier layer 326 through polarization effects when the barrier layer 326 is buried under ohmic contact metal. The barrier layer 326 may, for example, be from about 0.1 nm to about 30 nm thick, but is not so thick as to cause cracking or substantial defect formation therein. Barrier layer thicknesses in the range of 15-30 nm are common. In certain embodiments, the barrier layer 326 is undoped or doped with an n-type dopant to a concentration less than about $10^{19}$ $cm^{-3}$. In some embodiments of the present invention, the barrier layer 326 is $Al_xGa_{1-x}N$ where $0<x<1$. In particular embodiments, the aluminum concentration is about 25%. However, in other embodiments of the present invention, the barrier layer 326 comprises AlGaN with an aluminum concentration of between about 5% and less than about 100%. In specific embodiments of the present invention, the aluminum concentration is greater than about 10%. The channel layer 324 and/or the barrier layer 326 may be deposited, for example, by metal-organic chemical vapor deposition (MOCVD), molecular beam epitaxy (MBE), or hydride vapor phase epitaxy (HYPE). A 2DEG layer is induced in the channel layer 324 at a junction between the channel layer 324 and the barrier layer 326. The 2DEG layer acts as a highly conductive layer that allows conduction between the source and drain regions of the device that are beneath the source finger 156 and the drain finger 154, respectively. The channel layer 324 and the barrier layer 326 form part of the semiconductor layer structure 130.

While semiconductor layer structure 130 is shown with channel layer 324 and barrier layer 326 for purposes of illustration, semiconductor layer structure 130 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544, 963, 7,548,112, 7,592,211, 7,615,774, 7,548,112, and 7,709, 269, the disclosures of which are hereby incorporated herein in their entirety by reference. For example, an AlN buffer layer may be formed on the upper surface 322B of the substrate 322 to provide an appropriate crystal structure transition between the substrate 322 and the remainder of the semiconductor layer structure 130. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE.

The source finger 156 may be coupled to a reference signal such as, for example, a ground voltage. The coupling to the reference signal may be provided by a via 166 that extends from a lower surface 322A of the substrate 322, through the substrate 322 to an upper surface 326A of the barrier layer. The via 166 may expose a bottom surface of the source finger 156, though the present disclosure is not limited thereto. A backmetal layer 136 may be formed on the lower surface 322A of the substrate 322 and on side walls of the via 166. The backmetal layer 136 may be electrically coupled to the source finger 156.

Referring to FIGS. 1A and 1D, the metal submount 176 may act as a heat sink that dissipates heat that is generated in the transistor die 110. The heat is primarily generated in the upper portion of the transistor die 110 where relatively high current densities are generated in, for example, the channel regions of the unit cell transistors 116. This heat may be transferred to the metal submount 176 (e.g. through the semiconductor layer structure 130).

The backmetal layer 136 may be connected to a submount contact layer 146 on the submount 176. In some embodiments, the backmetal layer 136 and the submount contact layer 146 may form portions of the source terminal 126. The backmetal layer 136 may include a substrate contact layer 134 and a metal bonding layer 135. The metal bonding layer 135 may be used to form a bond between the substrate contact layer 134 and the submount contact layer 146. In some embodiments, the bond between the substrate contact layer 134 and the submount contact layer 146 may be thermally and/or electrically conductive. In some embodiments, the substrate contact layer 134 and/or the submount contact layer 146 may be optional and may not be present.

In some embodiments, the substrate contact layer 134 may include Ti, TiW, and/or Au, but the embodiments of the present disclosure are not limited thereto. In some embodiments, the substrate contact layer 134 may contain materials other than, or in addition to, Ti, TiW, and/or Au. In some embodiments, the substrate contact layer 134 may include Ti and/or TiW layers that are each 3000 to 6000 Å thick. In some embodiments, a layer of Au (e.g., between 2 μm to 8 μm) may be on the Ti and/or TiW layers in the substrate contact layer 134. In some embodiments, the submount contact layer 146 may be formed similarly to the substrate contact layer 134 (e.g., may include an Au layer of between 2 μm to 8 μm), but the present disclosure is not limited thereto. In some embodiments, the Au layer may not be present or may have a different thickness than described herein. In some embodiments, the substrate contact layer 134 and/or the submount contact layer 146 may include more or fewer layers than described, may include layers of different materials or material composition, and the layers may be in a different order and/or have different thickness than those described, without deviating from the scope of the present invention.

Referring to FIG. 1D, the metal bonding layer 135 may be formed between the substrate contact layer 134 and the submount contact layer 146. In some embodiments, the metal bonding layer 135 may be on portions of the substrate contact layer 134 that are within the via 166. Accordingly, portions of the metal bonding layer 135 may be at a same height and/or level above the submount 176 as portions of the substrate 322, channel layer 324, and/or the barrier layer 326.

The metal bonding layer 135 predominates by weight in nickel (Ni) and tin (Sn). In particular, the metal bonding layer 135 will comprise more than 50 percent by weight of nickel and tin, in some embodiments more than 75 percent nickel and tin, and in some embodiments more than 85 percent by weight of nickel and tin. In some embodiments, the metal bonding layer 135 may include a nickel-tin alloy.

The metal bonding layer 135 provides a method for bonding semiconductor wafers to one another. In this aspect, the method of creating the metal bonding layer 135 includes the step of heating a multi-layer metal structure between two semiconductor wafers. The multiple layers include adjacent first and second metal layers (e.g., Sn and Ni) with the first metal layer (Sn) having a melting point lower than the second metal layer (Ni) (e.g., the melting point of Sn at 232° C. vs. the melting point of Ni at 1455° C.). The metal structure has a relative amount of the first layer metal (Sn) that is greater than the amount that would be consumed by reacting with the second layer (Ni) alone during the heating step, but less than the amount that would provide a functional excess of the first metal (Sn) between the two bonded wafers. The heating step is carried out at a temperature between the melting point of the first (Sn) and second (Ni) layers until the first layer (Sn) reacts substantially completely with the second layer (Ni) and with the surface of the adjacent wafer.

As used herein, a "functional reaction excess" refers to an amount of the lower melting point metal that would negatively affect the function of the bond at temperatures approaching or near the lower melting point. Stated by way of example in terms of a first layer of tin (melting point 232° C.) adjacent a second layer of nickel (melting point 1455° C.), if a sufficient amount of unreacted tin were to remain after the heating step, then temperatures of just above 232° C. would melt the tin and frustrate the purpose of the bonding system. Thus, the relative amounts of the metals are chosen so that although small amounts or regions of the lower melting point metal may remain after reaction, they are insufficient to cause the bond to melt at such undesired low temperatures. This would compromise the mechanical integrity of the bonded structure. That is, the post-reaction melting point of the metal bonding layer 135 is greater than the melting point of the metal layer(s) having the lower melting point. Thus, prior implementations may have avoided the use of Sn without a high-power, high-temperature application. However, the use of Sn in amounts that are less than the amount that would provide a functional excess between the two bonded wafers reduces a risk that excess Sn will result in a structure that is vulnerable to issues under high-temperature operation.

In particular, in the two layer context, the metal structure is initially positioned on the first wafer with a higher melting point (second) metal positioned between the first wafer and the lower melting point (first) metal layer; i.e., the lower melting point layer is "exposed." As a result, when the lower melting point metal melts, it will be in contact with both the second metal and the second wafer. Stated differently, in the Ni—Sn embodiment the lower melting point metal (Sn) may be in a position to wet both the higher temperature metal (Ni) and the second substrate.

The heating step is also typically carried out at a temperature that is less than the melting point of the alloys or compounds that form between the metal layers during the heating step of the bonding/attachment process. The phrase "during the heating step," is used to confirm that the relative amounts described in the claims and the manner in which they react is understood in terms of the heating step that results in attachment to the submount and not in terms of some other duration of time over which the metals may happen to be in contact.

Although the nickel-tin system is both exemplary and useful for the purposes of the invention (particularly including higher throughput and lower cost than previous gold-tin systems), the lower temperature metal may also be selected to be other than tin, with bismuth, or combinations thereof, as useful alternatives. Similarly, although nickel is provided by way of example, the higher melting point temperature metal can be selected from the group consisting of nickel, cobalt, iron, copper and combinations thereof.

Due, in part, to the functional reaction between the first and second metal layers, the metal bonding layer 135 may include an alloy of the constituent first and second metal layers (e.g., a NiSn alloy). Because the metals form compounds, the heating step can typically be carried out at temperatures at or above about 250° C. With respect to the metals standing alone, the upper limit for the heating step is defined by the melting points of the alloys formed by the metals in the bonding system. Such a theoretical upper boundary is typically relatively high; i.e., the melting points of Ni—Sn compounds that range from about 30-70 weight percent tin are all above 750° C.). Thus, the practical upper limit is usually selected based upon the thermal characteristics of the substrates or of the devices on the substrates. These are generally much lower; e.g., as set forth herein, Group III nitride layers are preferably maintained below about 300° C. during other process steps. Because the melting point of the alloy of the two metals is much higher than that of the lower melting point metal (e.g., tin), the temperature used to form the metal bonding layer 135 may be much less than the remelting temperature of the resulting alloy. As a result, the metal bonding layer 135 formed from an alloy of nickel and tin may be able to withstand higher processing and/or operating temperatures than one or more of the constituent metal layers (e.g., the first metal layer, such as Sn). In contrast, prior AuSn alloys may remelt at much lower temperatures than that of the NiSn alloy, such as between 280-320° C., depending on the amount of Sn present. Therefore, once formed, the metal bonding layer 135 may perform advantageously in higher temperature processing and/or operation than prior devices.

In some embodiments, the metal bonding layer 135 may include a first portion 135A and a second portion 135B. The first portion 135A of the metal bonding layer 135 may be located between (e.g., in a vertical, or Z, direction in FIG. 1D) the substrate 322 and the submount 176. The second portion 135B of the metal bonding layer 135 may be located on sidewalls of the via 166. In some embodiments, a composition and/or physical characteristic of the first portion 135A of the metal bonding layer 135 may be different than a composition and/or physical characteristic of the second portion 135B of the metal bonding layer 135. For example, as part of the process for forming the metal bonding layer 135, pressure (e.g., downward pressure) may be applied to the transistor die 110 to facilitate contact with the submount 176. Due to the location of the first portion 135A of the metal bonding layer 135 between the transistor die 110 and the submount 176, the first portion 135A may be thinner (e.g., in a vertical Z direction) than the second portion 135B. Also, due to the contact between the first portion 135A of the metal bonding layer 135 and the contact layer 146 of the submount 176, a composition of the first portion 135A of the metal bonding layer 135 may include components from the contact layer 146 due to intermixing. The second portion 135b of the metal bonding layer 135 may be free of such components. In addition, in some embodiments, the application of pressure to the first portion 135A may cause the composition of the alloy (e.g., the NiSn alloy) of the first and second metal layers in the first portion 135A to be different than that of the second portion 135B. For example, during the application of heat (e.g., through the substrate 176) and/or pressure during the formation of the metal bonding layer 135, different amounts of the first metal layer (e.g., Sn) may react with the second metal layer (e.g., Ni). For example, in some embodiments, the second portion 135B of the metal bonding layer 135 may contain greater amounts of unreacted portions of the first or second metal than the first portion 135A.

The metal bonding layer 135 may be separated from the transistor die 110 in a first direction (e.g., a vertical direction in FIG. 1D). The metal bonding layer 135 may have a longest dimension W of the transistor die 110 in a second direction that is perpendicular to the first direction (e.g., a horizontal direction in FIGS. 1B and 1D). For example, the metal bonding layer 135 may have at least one longest dimension that exceeds 3.5 mm.

Though FIG. 1D illustrates that the metal bonding layer 135 is a single collective layer, it will be understood that the present disclosure is not limited thereto. In some embodiments, the metal bonding layer 135 may contain multiple layers. For example, in some embodiments, the metal bonding layer 135 may include one or more layers of a first metal (e.g., Sn), one or more layers of a second metal (e.g., Ni), one or more layers of additional metals (e.g., Au, Ti) one or more layers of a bonding barrier metal (e.g., platinum Pt), and/or one or more layers of an alloy of at least two of the preceding metals.

Figure 2A:
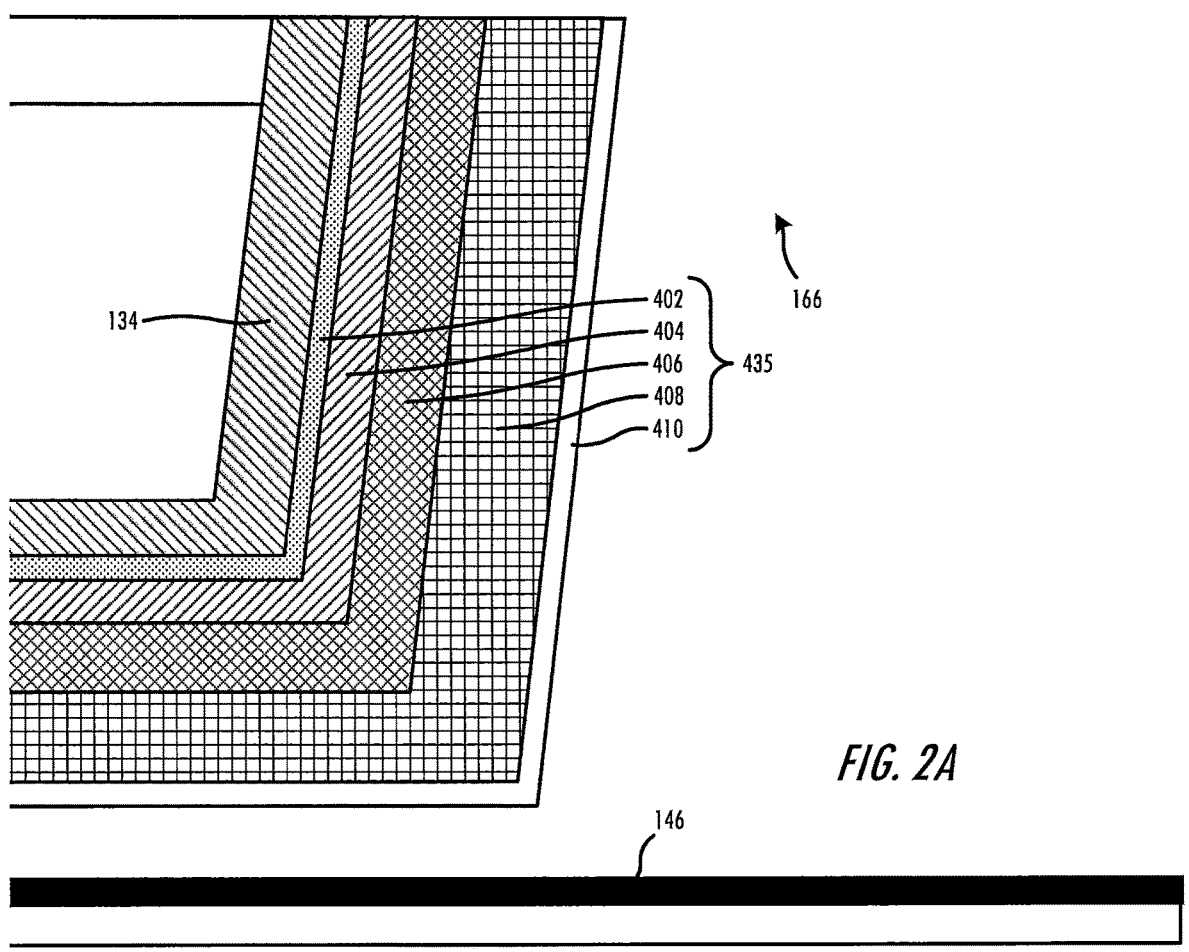
FIGS. 2A and 2B are schematic cross-sectional views of example metal bonding stacks, according to various embodiments of the present disclosure.
Figure 2B:
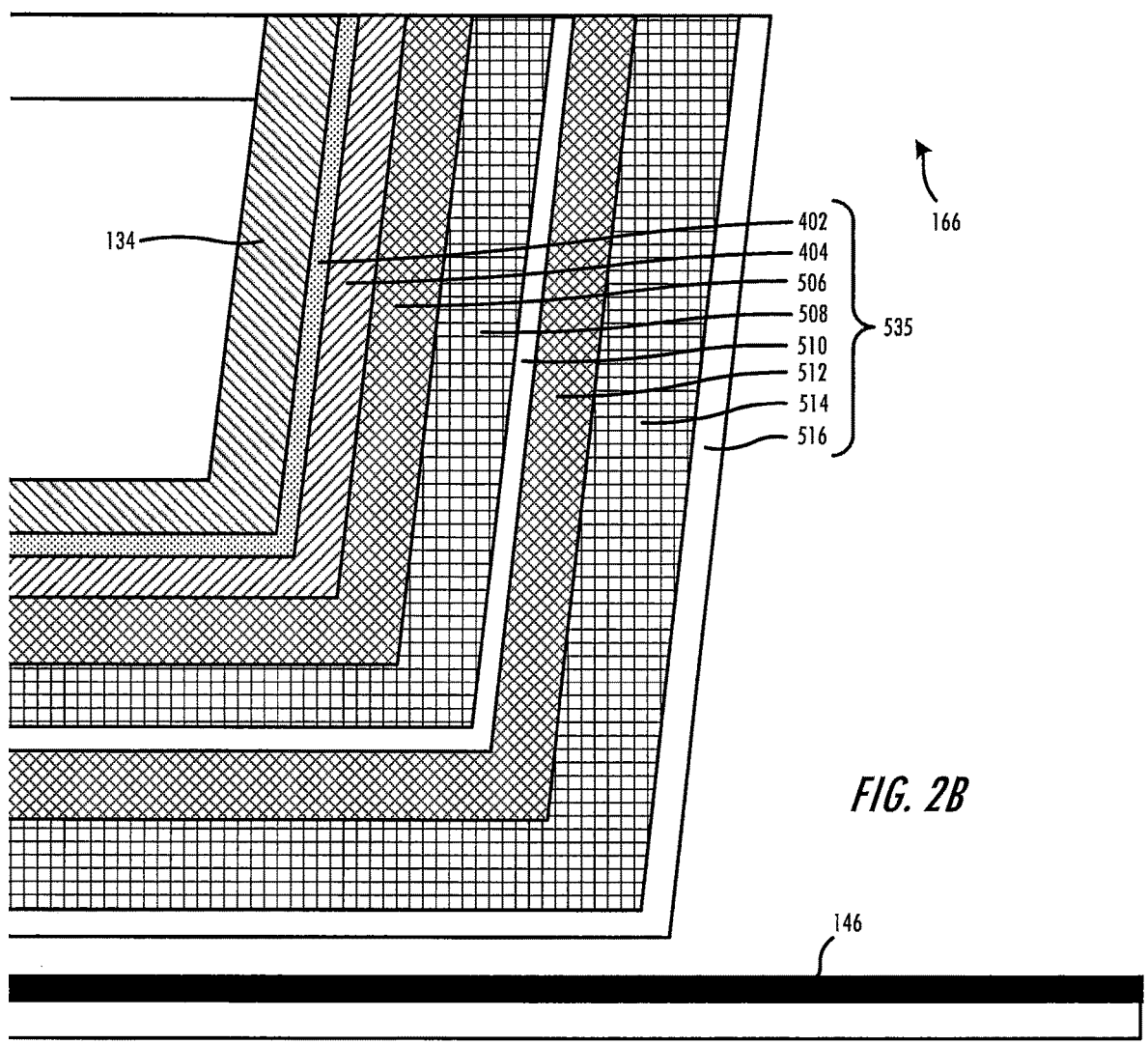

As discussed above, the metal bonding layer 135 may be formed by applying heat and/or pressure to a plurality of layers of a metal bonding stack. FIGS. 2A and 2B are schematic cross-sectional views of example metal bonding stacks, according to various embodiments of the present disclosure. FIGS. 2A and 2B represent an area of the transistor die 110 that is similar to that illustrated in FIG. 1D (e.g., area D of FIG. 1C) prior to the formation of the metal bonding layer 135 that bonds the transistor die 110 to the submount 176.

Referring to FIG. 2A, the metal bonding stack 435 may be formed on the substrate contact layer 134, which may be further formed on the substrate 322 of the transistor die 110. The substrate contact layer 134 may include one or more layers of Ti, TiW, and/or Au, though the present invention is not limited thereto. In some embodiments, the substrate contact layer 134 may contain materials other than, or in addition to, Ti, TiW, and/or Au. In some embodiments, the Ti and/or TiW may be sputtered onto the substrate 322. In some embodiments each of the Ti and/or TiW layers may be 3000 to 6000 Å thick. In some embodiments, a layer of Au (e.g., 1000 to 3000 Å) may be sputtered on the Ti and/or TiW and, subsequently, a thicker layer of Au may be formed by plating (e.g., greater than 2 μm) on the sputtered Au to form the substrate contact layer 134. In some embodiments, the Au layer may not be present or may have a different thickness than described herein. In some embodiments, the substrate contact layer 134 may include more or fewer layers than described, may include layers of different materials or material composition, and the layers may be in a different order and/or have different thickness than those described, without deviating from the scope of the present invention.

The metal bonding stack 435 may include layers that are sequentially stacked. For example, in order from closest to the substrate contact layer 134 to farthest from the substrate contact layer 134, the metal bonding stack 435 may contain an adhesion layer 402 (e.g., Ti), a bonding barrier layer 404 (e.g., Pt), a nickel layer 406, a tin layer 408, and a gold layer 410.

The adhesion layer 402 may be sputtered onto the substrate contact layer 134. In some embodiments, the adhesion layer 402 may be formed of Ti. In some embodiments, the adhesion layer 402 may be formed to have a thickness of between 250-750 Å. The adhesion layer 402 may assist in attaching the additional layers of the metal bonding stack 435 to the substrate contact layer 134.

The bonding barrier layer 404 may be sputtered on the adhesion layer 402. In some embodiments, the bonding barrier layer 404 may be formed of Pt. In some embodiments, the bonding barrier layer 404 may be formed to have a thickness of between 1200-1800 Å. The bonding barrier layer 404 may reduce and/or prevent a migration of tin from the tin layer 408 through the nickel layer 406 to the adhesion layer 402. The bonding barrier layer 404 may not be present in all embodiments.

The nickel layer 406 may be sputtered on the bonding barrier layer 404. In some embodiments, the nickel layer 406 may be formed to have a thickness of between 4500-7500 Å. The tin layer 408 may be sputtered on the nickel layer 406. In some embodiments, the tin layer 408 may be formed to have a thickness of between 1.5 µm-4.5 µm. Though example values are given for the thicknesses of the nickel layer 406 and the tin layer 408, the present disclosure is not limited to these thicknesses. Generally stated, the relative thicknesses of the nickel layer 406 and the tin layer 408 may be selected so as to be sufficient to provide an amount of tin that will react with the adjacent nickel layer to provide the desired Ni—Sn composition while still providing additional tin to wet and react with other adjacent metal layers.

The gold layer 410 may be sputtered on to the tin layer 408. In some embodiments, the gold layer 410 may be formed to have a thickness of between 150-450 Å. The gold layer 410 may be used to enhance the bonding connection, but may be provided in amounts much smaller than previously used.

The metal bonding stack 435 may be formed on the bottom portion of the substrate 322 as well as on sidewalls of the via 166. The transistor die 110 with the metal bonding stack 435 thereon may be placed on the submount contact layer 146 and the submount 176. In some embodiments, the metal bonding stack 435 may be placed so as to have at least a portion that directly contacts the submount contact layer 146 or the submount 176, but the present disclosure is not limited thereto. In some embodiments, a submount bonding stack may be additionally present on the submount contact layer 146 or the submount 176 so as to be between the metal bonding stack 435 and the submount 176. The submount bonding stack, when present, may be similar to the metal bonding stack 435. That is to say that a submount bonding stack may include Ni and Sn in similar quantities to the metal bonding stack 435. However, the present disclosure is not limited thereto. In some embodiments, the substrate contact layer 134 and/or the submount contact layer 146 may be optional and may not be present. In some embodiments, the substrate contact layer 134 and/or the submount contact layer 146 may include more or fewer layers than described, may include layers of different materials or material composition, and the layers may be in a different order and/or have different thickness than those described, without deviating from the scope of the present invention.

Once the metal bonding stack 435 is placed adjacent the submount contact layer 146 or the submount 176, heat and/or pressure may be applied to the combination of the transistor die 110 and the submount 176 to form metal bonding layer 135 (see FIG. 1D).

FIG. 2B is a schematic cross-section of another example of a metal bonding stack 535, according to some embodiments of the present disclosure. For example, metal bonding stack 535 may include layers that are selectively stacked. For example, in order from closest to the substrate contact layer 134 to farthest from the substrate contact layer 134, the metal bonding stack 535 may contain an adhesion layer 402 (e.g., Ti), a bonding barrier layer 404 (e.g., Pt), a first nickel layer 506, a first tin layer 508, a first gold layer 510, a second nickel layer 512, a second tin layer 514, and a second gold layer 516.

The formation and structure of the substrate contact layer 134, the adhesion layer 402, and the bonding barrier layer 404 of FIG. 2B may be similar to substrate contact layer 134, the adhesion layer 402, and the bonding barrier layer 404 described with respect to FIG. 2A and, as such, a duplicate description thereof will be omitted.

The first nickel layer 506 may be sputtered on the bonding barrier layer 404. In some embodiments, the first nickel layer 506 may be formed to have a thickness of between 4000-6500 Å. The first tin layer 508 may be sputtered on the first nickel layer 506. In some embodiments, the first tin layer 508 may be formed to have a thickness of between 1.25 µm-2.0 µm. The first gold layer 510 may be sputtered on to the first tin layer 508. In some embodiments, the first gold layer 510 may be formed to have a thickness of between 140-180 Å. In some embodiments, the first gold layer 510 may not be present. The second nickel layer 512 may be sputtered on the first gold layer 510 (when present) or the first tin layer 508. In some embodiments, the second nickel layer 512 may be formed to have a thickness of between 6800-7750 Å. The second tin layer 514 may be sputtered on the second nickel layer 512. In some embodiments, the second tin layer 514 may be formed to have a thickness of between 1.25 µm-2.0 µm. The second gold layer 516 may be sputtered on to the second tin layer 514. In some embodiments, the second gold layer 516 may be formed to have a thickness of between 300-380 Å.

Though example values are given for the thicknesses of the first nickel layer 506, the first tin layer 508, the second nickel layer 512, and the second tin layer 514, the present disclosure is not limited to these thicknesses. Generally stated, the relative thicknesses of the first nickel layer 506, the first tin layer 508, the second nickel layer 512, and the second tin layer 514 may be selected so as to be sufficient to provide an amount of tin that will react with the adjacent nickel layer to provide the desired Ni—Sn composition while still providing additional tin to wet and react with other adjacent metal layers. The use of multiple nickel and tin layers may increase an amount of nickel and tin that react together and reduce an amount of unreacted tin that remains in the resulting metal bonding layer 135.

As with the metal bonding stack 435 of FIG. 2A, the metal bonding stack 535 of FIG. 2B may be formed on the bottom portion of the substrate 322 as well as on sidewalls of the via 166. The transistor die 110 with the metal bonding stack 535 thereon may be placed on the submount contact layer 146 and the submount 176. In some embodiments, at least a portion of the metal bonding stack 535 may be placed so as to directly contact the submount contact layer 146 or the submount 176, but the present disclosure is not limited thereto. In some embodiments, a submount bonding stack may be additionally present on the submount contact layer 146 or the submount 176 so as to be between the metal bonding stack 535 and the submount 176. The submount bonding stack, when present, may be similar to the metal bonding stack 535 and/or the metal bonding stack 435 described with respect to FIG. 2A. That is to say that a submount bonding stack may include Ni and Sn in similar quantities to the metal bonding stack 435 or the metal bonding stack 535. In some embodiments, the substrate contact layer 134 and/or the submount contact layer 146 may be optional and may not be present. In some embodiments, the substrate contact layer 134 and/or the submount contact layer 146 may include more or fewer layers than described, may include layers of different materials or material composition, and the layers may be in a different order and/or have different thickness than those described, without deviating from the scope of the present invention.

The embodiment of the metal bonding stack 535 of FIG. 2B may differ from the metal bonding stack 435 of FIG. 2A in that additional second layers of nickel 512, tin 514, and gold 516 are formed on the first layers of nickel, tin, and gold. The additional layers may provide a higher die shear and may provide more robustness with respect to thermal stresses. For example, the additional nickel and/or gold within the metal bonding stack 535 may reduce areas of unreacted tin in the resulting metal bonding layer.

Figure 3A:
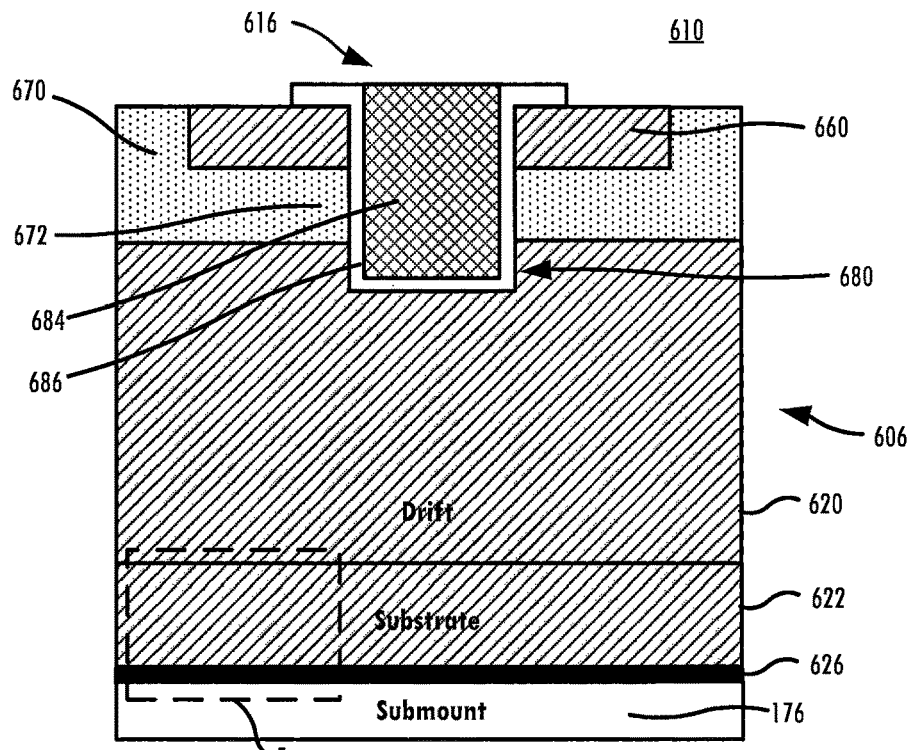
FIG. 3A is a schematic cross-sectional view of a unit cell of a vertical MOSFET device, according to various embodiments of the present disclosure.
Figure 3B:
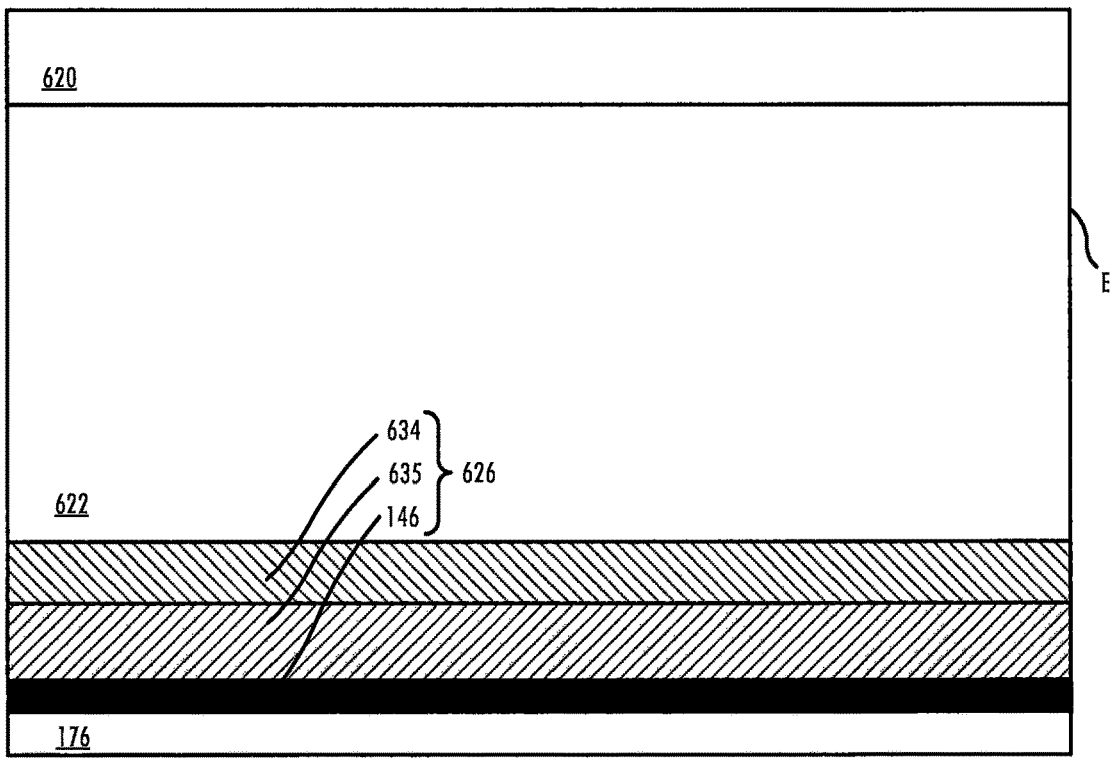
FIG. 3B is a schematic cross-section showing detail of an area E of FIG. 3A.

FIGS. 1A to 2B illustrate the utilization of a metal bonding stack to provide a metal bonding layer in a transistor device incorporated as a HEMT, but the present disclosure is not limited thereto. FIGS. 3A and 3B illustrate the application of the embodiments of the present disclosure of a vertical metal-oxide semiconductor field effect transistor (MOSFET). The NiSn die attach system described herein may work equally well with both HEMT and MOSFET devices, as well as in amplifier and/or power switching structures. FIG. 3A is a schematic cross-sectional view of a unit cell 316 of a vertical MOSFET device, according to various embodiments of the present disclosure. FIG. 3B is a schematic cross-section showing detail of an area E of FIG. 3A.

FIG. 3A is a schematic cross-sectional diagram of a first wide band-gap power MOSFET unit cell 616 formed in a transistor die 610. The MOSFET unit cell 616 may be part of an amplifier or a power switching device, though the disclosure is not limited thereto. As shown in FIG. 3A, the power MOSFET unit cell 616 includes a heavily-doped (n$^+$) n-type substrate 622 (e.g., silicon carbide). A lightly-doped (n$^-$) drift region 620 is provided on the substrate 622. A moderately-doped p-type well layer 670 is formed on the upper surface of the n-type drift region 620. The moderately-doped p-type well layer 670 may be formed, for example, by epitaxial growth. This moderately-doped p-type well layer 670 may provide p-wells 672 for the unit cell 616. A heavily-doped n$^+$ source region 660 may be formed in an upper region of the p-type well layer 670. The heavily-doped n$^+$ source region 660 may be formed for example, by ion implantation.

The substrate 622, drift region 620, the moderately doped p-type well layer 670, and the heavily-doped n$^+$ source regions 660, along with the various regions/patterns formed therein, comprise a semiconductor layer structure 606 of the MOSFET unit cell 616.

Gate trenches 680 are formed in the semiconductor layer structure 606. The gate trenches 680 may extend through the heavily-doped n$^+$ source region 660 and the moderately-doped p-type well layer 670 and into the drift region 620. A gate insulating layer 686 may be formed on the bottom surface and sidewalls of each gate trench 680. A gate electrode 684 may be formed on each gate insulating layer 686 to fill the respective gate trenches 680.

Source contacts (not shown) may be formed on the heavily-doped n-type source regions 660. A gate contact (not shown) may be formed on the gate electrode 684. A drain contact 626 may be formed on the lower surface of the substrate 622. In a packaged device, the drain contact 626 may be connected to a submount 176.

Though FIG. 3A illustrates an embodiment in which a MOSFET utilizes a gate trench configuration, it will be understood that this is merely an example and not intended to limit the present disclosure. In some embodiments, a planar gate configuration may be used without deviating from the scope of the present disclosure.

Referring to FIGS. 3A and 3B, the submount 176 may act as a heat sink that dissipates heat that is generated in the transistor die 610. The submount 176 may also provide a connection to the drain contact 626. The drain contact 626 may include a substrate contact layer 634 that is electrically connected to a submount contact layer 146 on the submount 176. The substrate contact layer 634 may be formed similarly to the substrate contact layer 134 described herein. For example, the substrate contact layer 634 may include Ti, TiW, and/or Au, but the embodiments of the present disclosure are not limited thereto. In some embodiments, the substrate contact layer 634 may contain materials other than, or in addition to, Ti, TiW, and/or Au. The substrate contact layer 634 may be coupled to the submount contact layer 146 by a metal bonding layer 635. In some embodiments, the bond provided by the metal bonding layer 635 between the substrate contact layer 634 and the submount contact layer 146 may be thermally and/or electrically conductive. In some embodiments, the substrate contact layer 634 and/or the submount contact layer 146 may be optional and may not be present. In some embodiments, the substrate contact layer 634 and/or the submount contact layer 146 may include more or fewer layers than described, may include layers of different materials or material composition, and the layers may be in a different order and/or have different thickness than those described, without deviating from the scope of the present invention.

Referring to FIG. 3B, the metal bonding layer 635 may be formed between the substrate contact layer 634 and the submount contact layer 146. The metal bonding layer 635 predominates by weight in nickel (Ni) and tin (Sn). The metal bonding layer 635 may include an NiSn alloy. In particular, the metal bonding layer 635 will comprise more than 50 percent by weight of nickel and tin, in some cases more than 75 percent nickel and tin, and in some embodiments more than 85 percent by weight of nickel and tin. The metal bonding layer 635 of FIG. 3B may differ from the metal bonding layer 135 of FIG. 1D in that the transistor die 610 may not incorporate a via (e.g., via 166 of FIG. 1C) within the substrate 622. As such, the metal bonding layer 635 of FIG. 3B may not be disposed within a via of the device. The metal bonding layer 635 may be formed using metal bonding stacks that are substantially similar to the metal bonding stack 435 of FIG. 2A or the metal bonding stack 535 of FIG. 2B. As such, a duplicate description thereof will be omitted.

Figure 4A:
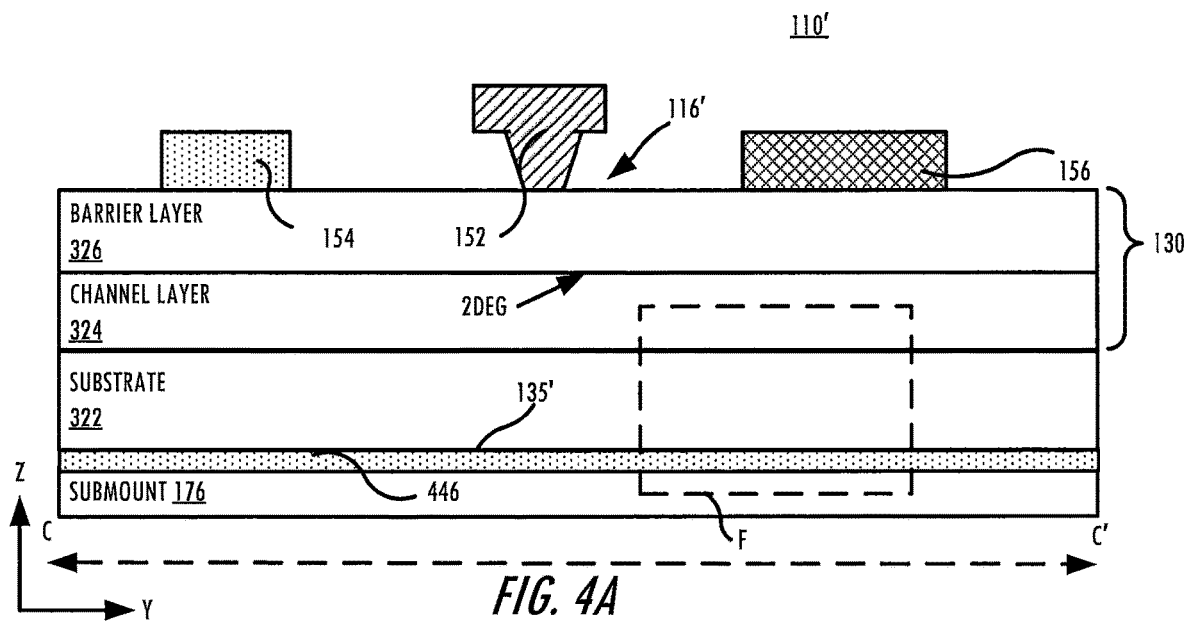
FIG. 4A is a schematic cross-sectional view of a transistor amplifier die unit cell in accordance with various embodiments of the present disclosure.
Figure 4B:
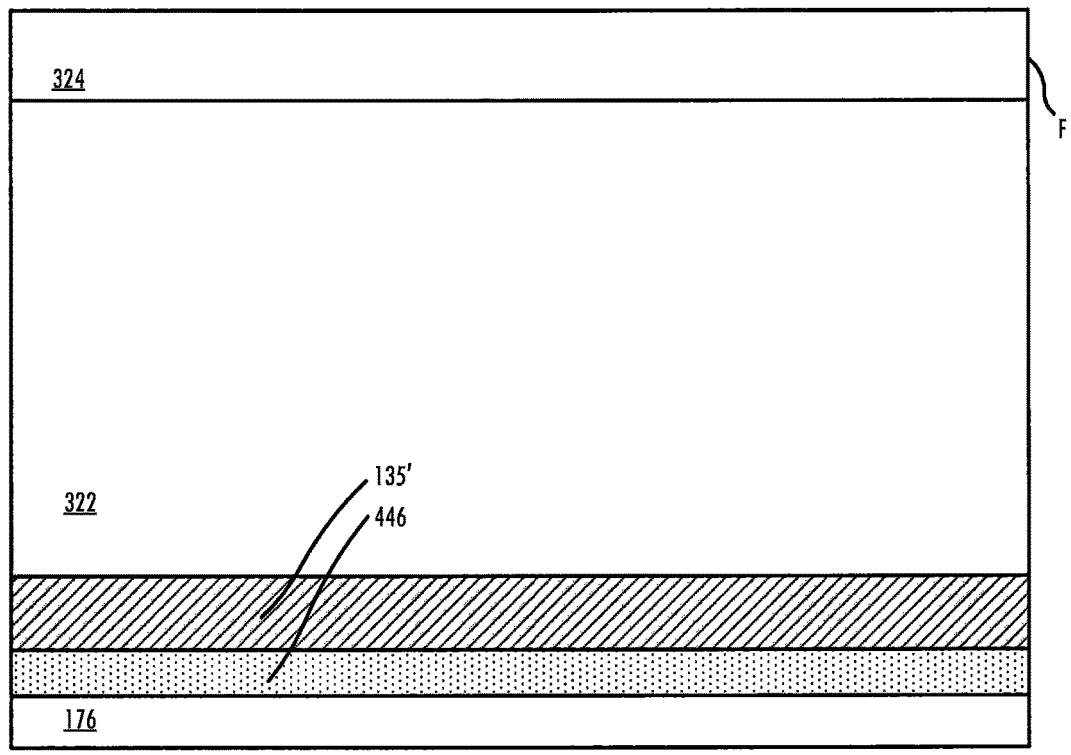
FIG. 4B is a schematic cross-section showing detail of an area F of FIG. 4A.

The prior-described figures have included embodiments in which the metal bonding layer is utilized to provide electrical connections to a submount. However, the present disclosure is not limited thereto. In some embodiments, the metal bonding layer may be utilized to provide a thermal connection to the submount. For example, FIG. 4A is a schematic cross-sectional view of a transistor die unit cell 116' of a transistor die 110' in accordance with various embodiments of the present disclosure. The transistor die unit cell 116' may be part of an amplifier or a power switching device, though the disclosure is not limited thereto. FIG. 4B is a schematic cross-section showing detail of an area F of FIG. 4A. Given the similarity of FIG. 4A to that of FIG. 1C, a description of similar or identical features will be omitted, and the description will focus primarily on the differences between the two embodiments.

The transistor die unit cell 116' of FIG. 4A differs from the transistor die unit cell 116 of FIG. 1C in that a via 166 is not provided. For example, source connections may be provided by the application of a signal to source finger 156 (e.g., by a metal contact) rather than by a via through the substrate 322. As a result, the die unit cell 116' may not require a source terminal on the bottom surface of the substrate 322. Thus, the metal bonding layer 135' may connect the substrate 322 to the submount 176 without the use of substrate and/or submount contact layers.

In some embodiments, a thermal layer 446 may be provided between the transistor die 110' and the submount 176. The thermal layer 446 may be a thermally conductive material, such as a metal layer, that may facilitate the transfer of heat from the substrate 322 to the submount 176. The thermal layer 446 may be omitted in some embodiments.

Referring to FIG. 4B, the metal bonding layer 135' may include an NiSn alloy and may be formed between the substrate 322 and the submount 176 and/or the thermal layer 446. The metal bonding layer 135' predominates by weight in nickel (Ni) and tin (Sn). In particular, the metal bonding layer 135' will comprise more than 50 percent by weight of nickel and tin, in some cases more than 75 percent nickel and tin, and in some embodiments more than 85 percent by weight of nickel and tin.

Figure 5A:
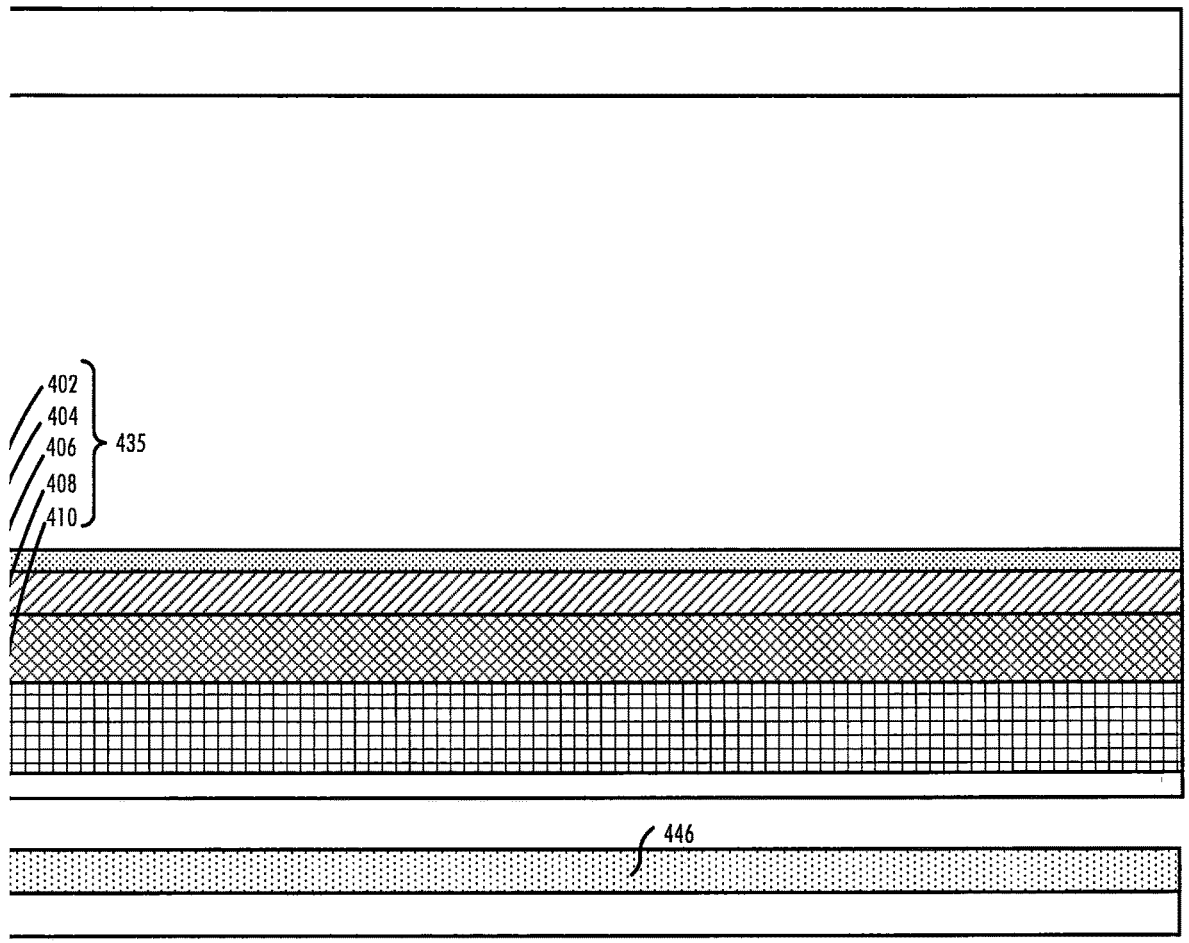
FIGS. 5A and 5B are schematic cross-sectional views of example metal bonding stacks, according to various embodiments of the present disclosure.
Figure 5B:
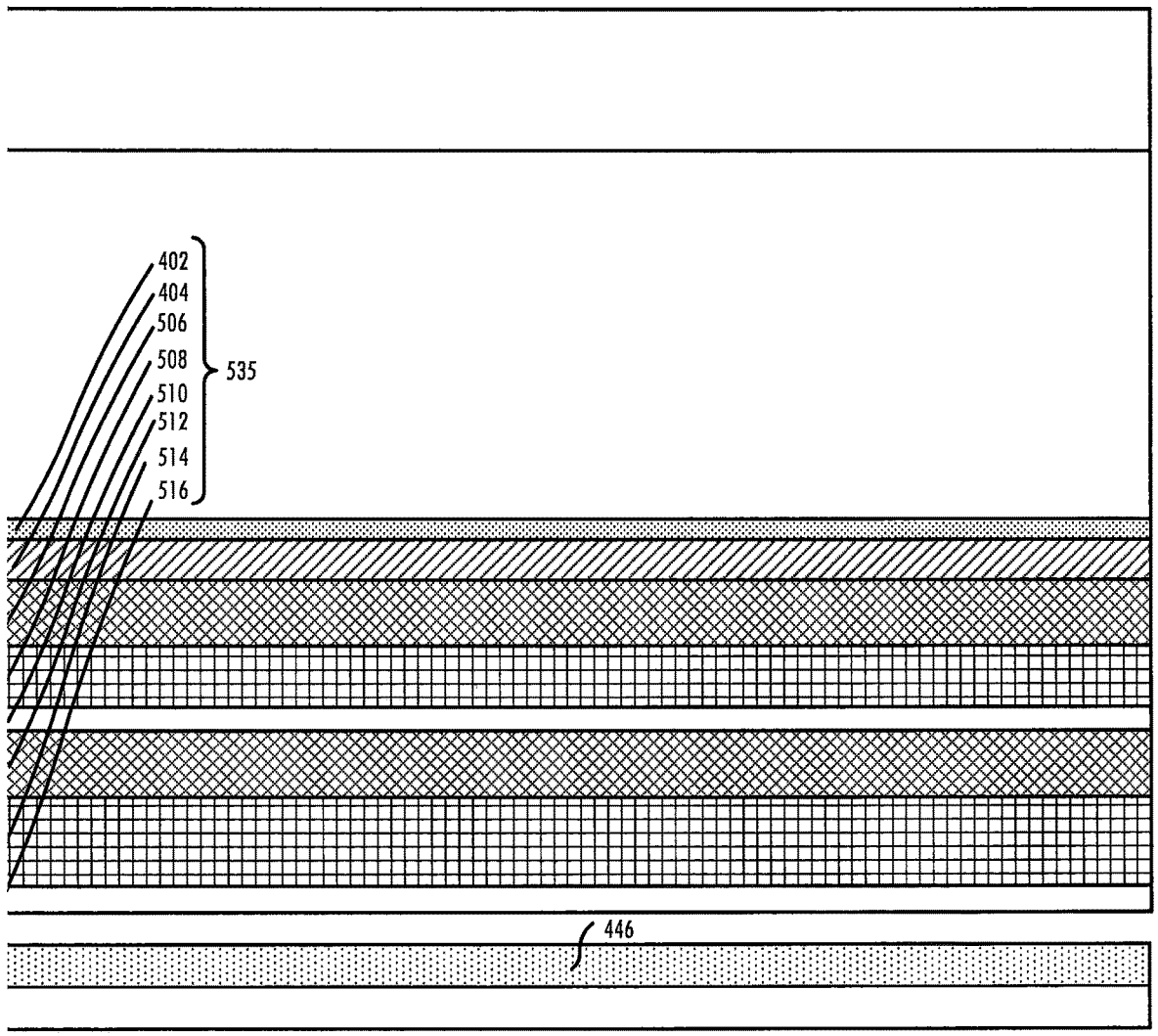

A metal bonding stack used to form the metal bonding layer 135' may be similar to those used to form the metal bonding layer 135 of FIG. 1D, with the exception of the absence of a contact layer (e.g., substrate contact layer 134 of FIG. 1D) between the metal bonding stack and the substrate 322. FIGS. 5A and 5B are schematic cross-sectional views of example metal bonding stacks, according to various embodiments of the present disclosure. FIGS. 5A and 5B represent an area of the transistor die 110' that is similar to that illustrated in FIG. 4B (e.g., area F of FIG. 4A) prior to the formation of the metal bonding layer 135'.

For example, FIG. 5A is a schematic cross-section of an example metal bonding stack 435, according to some embodiments of the present disclosure. Referring to FIG. 5A, the metal bonding stack 435 may be formed on the substrate 322 of the transistor die 110'.

The metal bonding stack 435 may include layers that are selectively stacked. For example, in order from closest to the substrate 322 to farthest from the substrate 322, the metal bonding stack 435 may contain an adhesion layer 402 (e.g., Ti), a bonding barrier layer 404 (e.g., Pt), a nickel layer 406, a tin layer 408, and a gold layer 410. The formation and structure of the adhesion layer 402, the bonding barrier layer 404, the nickel layer 406, the tin layer 408, and the gold layer 410 are similar to those discussed herein with respect to FIG. 2A and, as such, a duplicate description thereof will be omitted.

The metal bonding stack 435 may be formed on the bottom portion of the substrate 322. The transistor die 110' with the metal bonding stack 435 thereon may be placed on the thermal layer 446 (if present) and the submount 176. In some embodiments, the metal bonding stack 435 may be placed so as to directly contact the thermal layer 446 (if present) or the submount 176, but the present disclosure is not limited thereto. In some embodiments, a submount bonding stack may be additionally present on the thermal layer 446 (if present) or the submount 176 so as to be between the metal bonding stack 435 and the submount 176. The submount bonding stack, when present, may be similar to the metal bonding stack 435. That is to say that a submount bonding stack may include Ni and Sn in similar quantities to the metal bonding stack 435. However, the present disclosure is not limited thereto.

Once the metal bonding stack 435 is placed adjacent the thermal layer 446 or the submount 176, heat and/or pressure may be applied to the combination of the transistor die 110' and the submount 176 to form metal bonding layer 135' (see FIG. 4B).

Embodiments in which a contact layer is not present may also use the metal bonding stack previously described with respect to FIG. 2B. FIG. 5B is a schematic cross-section of another example metal bonding stack 535 in which a contact layer is not present, according to some embodiments of the present disclosure.

For example, metal bonding stack 535 may include layers that are selectively stacked. For example, in order from closest to the substrate 322 to farthest from the substrate contact layer 134, the metal bonding stack 535 may contain an adhesion layer 402 (e.g., Ti), a bonding barrier layer 404 (e.g., Pt), a first nickel layer 506, a first tin layer 508, a first gold layer 510, a second nickel layer 512, a second tin layer 514, and a second gold layer 516. The formation and structure of the adhesion layer 402, the bonding barrier layer 404, the first nickel layer 506, the first tin layer 508, the first gold layer 510, the second nickel layer 512, the second tin layer 514, and the second gold layer 516 are similar to those discussed herein with respect to FIG. 2B and, as such, a duplicate description thereof will be omitted.

Figure 6A:
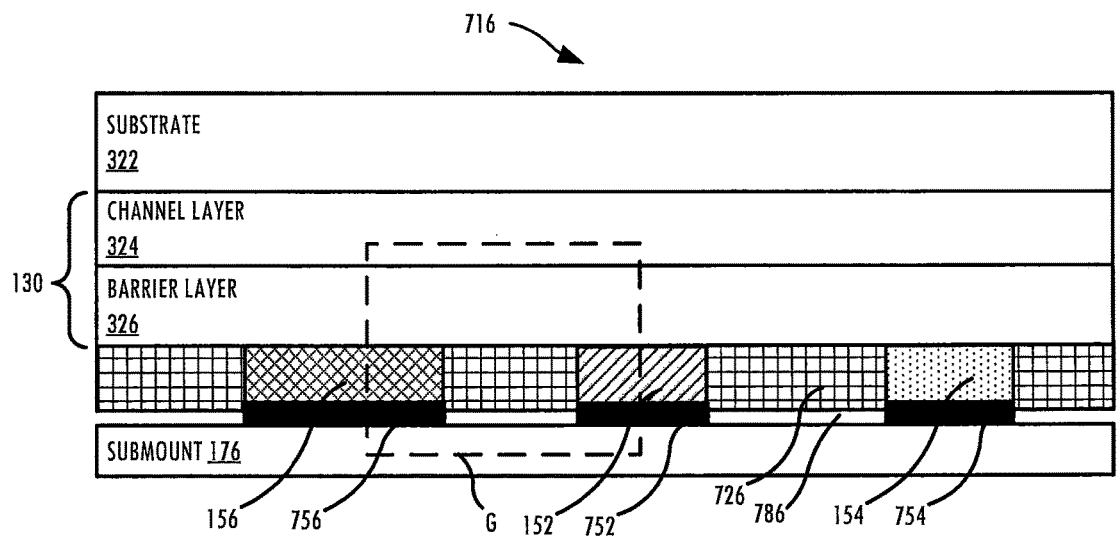
FIG. 6A is a schematic cross-sectional view of a unit cell of a HEMT device in a flip-chip configuration, according to various embodiments of the present disclosure.
Figure 6B:
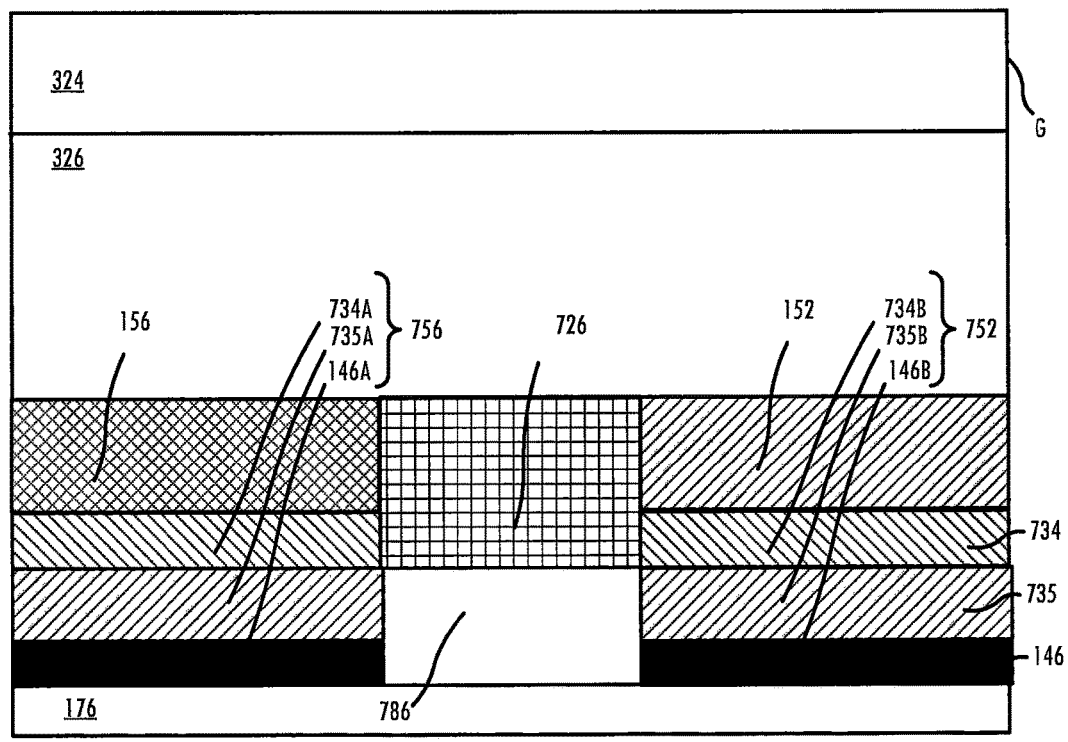
FIG. 6B is a schematic cross-section showing detail of an area G of FIG. 6A.

The prior figures illustrate the utilization of a metal bonding stack to provide a metal bonding layer between a substrate of a device and a submount, but the present disclosure is not limited thereto. FIGS. 6A and 6B illustrate the application of the embodiments of the present disclosure in a flip-chip configuration. FIG. 6A is a schematic cross-sectional view of a unit cell 716 of a HEMT device in a flip-chip configuration, according to various embodiments of the present disclosure. The unit cell 716 may be part of an amplifier or a power switching device, though the disclosure is not limited thereto. FIG. 6B is a schematic cross-section showing detail of an area G of FIG. 6A. Given the similarity of FIG. 6A to that of FIGS. 1C and 4A, a description of similar or identical features will be omitted, and the description will focus primarily on the differences between the two embodiments. In a flip-chip configuration, the semiconductor layer structure 130 is "flipped" so that the substrate 322 is an upper layer of the unit cell 716. In contrast to the embodiments of FIGS. 1C and 4A, the gate, drain, and source terminals 152, 154, 156 may be electrically coupled to the submount 176 using gate contacts 752, drain contacts 754, and source contacts 756 respectively.

Referring to FIGS. 6A and 6B, the submount 176 may provide electrical connections to the terminals of the unit cell 716 by way of the gate contact 752, the drain contact 754, and the source contact 756, respectively. Since each of the gate terminal 152, the drain terminal 154, and the source terminal 156 may be electrically isolated from one another, each of gate terminal 152, the drain terminal 154, and the source terminal 156 may be electrically connected to separate portions of a submount contact layer 146. For example, the submount contact layer 146 may be separated into a first portion 146A, a second portion 146B, and a third portion (not shown). Similarly, contacts coupling the gate terminal 152, the drain terminal 154, and the source terminal 156 to the portions of the submount contact layer 146 may include portions of a terminal contact layer 734 and a metal bonding layer 735. The terminal contact layer 734 may be formed similarly to the substrate contact layer 134 described herein. For example, the terminal contact layer 734 may include Ti, TiW, and/or Au, but the embodiments of the present disclosure are not limited thereto. In some embodiments, the terminal contact layer 734 may contain materials other than, or in addition to, Ti, TiW, and/or Au. The terminal contact layer 734 may be separated into a first portion 734A, a second portion 734B, and a third portion (not shown). The metal bonding layer 735 may be separated into a first portion 735A, a second portion 735B, and a third portion (not shown). In some embodiments, the substrate contact layer 734 and/or the submount contact layer 146 may be optional and may not be present. In some embodiments, the substrate contact layer 734 and/or the submount contact layer 146 may include more or fewer layers than described, may include layers of different materials or material composition, and the layers may be in a different order and/or have different thickness than those described, without deviating from the scope of the present invention.

The source contact 756 may include the first portion of the terminal contact layer 734A that is electrically connected to the first portion of the submount contact layer 146A on the submount 176. The first portion of the terminal contact layer 734A may be coupled to the first portion of the submount contact layer 146A by the first portion of the metal bonding layer 735A. In some embodiments, the bond provided by the first portion of the metal bonding layer 735A between the first portion of the terminal contact layer 734A and the first portion of the submount contact layer 146A may be thermally and/or electrically conductive.

The gate contact 752 may include the second portion of the terminal contact layer 734B that is electrically connected to the second portion of the submount contact layer 146B on the submount 176. The second portion of the terminal contact layer 734B may be coupled to the second portion of the submount contact layer 146B by the second portion of the metal bonding layer 735B. In some embodiments, the bond provided by the second portion of the metal bonding layer 735B between the second portion of the terminal contact layer 734B and the second portion of the submount contact layer 146B may be thermally and/or electrically conductive.

Though FIG. 6B does not expressly show the drain contact 754, it will be understood that its structure is similar to those of the gate contact 752 and the source contact 756. In some embodiments, for example, the drain contact 754 may include a third portion of the terminal contact layer that is electrically connected to a third portion of the submount contact layer on the submount 176. The third portion of the terminal contact layer may be coupled to the third portion of the submount contact layer by a third portion of the metal bonding layer. In some embodiments, the bond provided by the third portion of the metal bonding layer between the third portion of the terminal contact layer and the third portion of the submount contact layer may be thermally and/or electrically conductive.

In some embodiments, an insulating layer 726 may be disposed between respective ones of the gate, drain, and source terminals 152, 154, 156 and/or between respective ones of the gate, drain, and source contacts 752, 754, 756, though the embodiments of the present disclosure are not limited thereto. In some embodiments, the respective ones of the gate, drain, and source terminals 152, 154, 156 and/or the respective ones of the gate, drain, and source contacts 752, 754, 756 may be alternatively or additionally separated by an air gap 786. Though FIGS. 6A and 6B show the insulating layer 726 not extending all the way to the submount 176, with the air gap 786 therebetween, the embodiments of the present disclosure are not limited thereto. In some embodiments, the insulating layer 726 may extend all the way to the submount 176. In some embodiments, the insulating layer 726 may be omitted and the air gap 786 may extend all the way from the submount 176 to an upper surface of the semiconductor layer structure 130.

Referring to FIG. 6B, the first portion 735A, the second portions 735B, and the third portion of the metal bonding layer 735 may be formed between the respective first, second and third portions of the terminal contact layer 734 and the submount contact layer 146. The terminal contact layer 734 may be similar to the substrate contact layer 134 discussed with respect to FIGS. 1A to 1E. In particular, in some embodiments, the terminal contact layer 734 and/or the submount contact layer 146 may include a layer of Au (e.g., between 2 μm to 8 μm), though the present disclosure is not limited thereto. In some embodiments, the submount contact layer 146 may be omitted.

The metal bonding layer 735 predominates by weight in nickel (Ni) and tin (Sn). The metal bonding layer 735 may include an NiSn alloy. In particular, the metal bonding layer 735 will comprise more than 50 percent by weight of nickel and tin, in some cases more than 75 percent nickel and tin, and in some embodiments more than 85 percent by weight of nickel and tin. The metal bonding layer 735 of FIG. 6B may differ from the metal bonding layer 135 of FIG. 1D in that the metal bonding layer 735 may be separated into a first portion 735A, a second portion 735B, and a third portion, with gaps between each of the portions. The metal bonding layer 735 may be formed using a metal bonding stack that is substantially similar to the metal bonding stack 435 of FIG. 2A or the metal bonding stack 535 of FIG. 2B. As such, a duplicate description thereof will be omitted. In some embodiments, the metal bonding stack may be first deposited and then patterned to form first, second, and third portions, which are subsequently converted to the first, second, and third portions of the metal bonding layer 735 through the application of heat and/or pressure when attaching the gate, drain, and source terminals 152, 154, 156 to the submount 176.

Though FIG. 6A illustrates an embodiment in which a source via is not present, such as source via 166 of FIG. 1C, it will be understood that this is merely an example and not intended to limit the present disclosure. In some embodiments, a source via may be used without deviating from the scope of the present disclosure. In an embodiment in which a source via is present, the source terminal 156 (as well as the contact layers and bonding layers associated therewith) may or may not be present, depending on the design of the device and its associated interconnections.

Although various embodiments of transistor configurations have been described and illustrated herein with reference to regions of specific conductivity types (i.e., n-type and p-type) by way of example, it will be understood that the conductivity types of the regions in any of the illustrated examples may be reversed (i.e., p-type and n-type) in accordance with embodiments of the present disclosure. Thus, it will be appreciated that the present invention covers both n-channel and p-channel devices for each different device structure.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be understood that several of the figures of the present disclosure are schematic cross-sectional diagrams and are sized for illustration purposes rather than proportional and literal accuracy. As described herein, some of the illustrated layers are in reality several orders of magnitude different from one another in thickness, and attempting to illustrate such literally would decrease, rather than increase the clarity of this description.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A transistor device structure, comprising:
   a submount;
   a transistor die on the submount, the transistor die comprising a Group III-nitride and/or silicon carbide material and a semiconductor substrate; and
   a metal bonding layer between the submount and the transistor die, the metal bonding layer providing mechanical attachment of the transistor die to the submount along a contact area between the transistor die and the submount, wherein a longest dimension of the metal bonding layer along the contact area exceeds 3.5 mm,
   wherein the metal bonding layer comprises gold, tin and nickel, and wherein a weight percentage of a combination of nickel and tin in the metal bonding layer is greater than 50 percent and a weight percentage of gold in the metal bonding layer is less than 25 percent, and wherein an interface between the metal bonding layer and the transistor die is substantially free of unreacted tin.

2. The transistor device structure of claim 1, wherein the weight percentage of gold in the metal bonding layer is less than 10 percent.

3. The transistor device structure of claim 1, wherein the metal bonding layer further comprises a plurality of sublayers including a metal barrier layer that is between a portion of the metal bonding layer comprising tin and the transistor die, wherein the metal barrier layer is distinct from the portion of the metal bonding layer comprising tin.

4. The transistor device structure of claim 1, further comprising a substrate contact layer between the metal bonding layer and the transistor die.

5. The transistor device structure of claim 4, wherein the substrate contact layer comprises a gold layer having a thickness between 2 µm and 8 µm.

6. The transistor device structure of claim 1, wherein the transistor die comprises:
a channel layer on the substrate;
a barrier layer on the channel layer;
a via that penetrates the substrate, the channel layer, and the barrier layer,
wherein a first portion of the metal bonding layer is between the substrate and the submount, and
wherein a second portion of the metal bonding layer is on a sidewall of the via.

7. The transistor device structure of claim 6, wherein the second portion of the metal bonding layer comprises greater amounts of unreacted nickel or tin than the first portion of the metal bonding layer.

8. The transistor device structure of claim 1, wherein the transistor die comprises a gate terminal and a drain terminal, and
wherein the metal bonding layer electrically connects the gate terminal to the submount.

9. The transistor device structure of claim 1, wherein an operating frequency of the transistor device structure is between 500 MHz and 75 GHz.

10. The transistor device structure of claim 1, wherein a power output of the transistor device structure is between 50 W and 200 W.

11. The transistor device structure of claim 1, wherein the longest dimension of the metal bonding layer is between 4 mm and 10 mm along the contact area.

12. The transistor device structure of claim 1, wherein the transistor device structure comprises a flip chip configuration wherein an active region of the transistor die is adjacent the submount with the metal bonding layer therebetween.

13. A transistor device structure, comprising:
a submount;
a transistor die on the submount, the transistor die comprising a Group III-nitride and/or silicon carbide material and a semiconductor substrate, the transistor die having a surface facing the submount; and
a metal bonding layer between the submount and the transistor die, the metal bonding layer providing mechanical attachment of the transistor die to the submount, wherein a longest dimension of the metal bonding layer along the surface exceeds 3.5 mm,
wherein the metal bonding layer comprises nickel and tin, and a weight percentage of a combination of nickel and tin in the metal bonding layer is greater than about 50 percent, and
wherein an interface between the metal bonding layer and the transistor die is substantially free of unreacted tin.

14. The transistor device structure of claim 13, further comprising a contact layer between the submount and the metal bonding layer.

15. The transistor device structure of claim 14 wherein the contact layer comprises a gold layer having a thickness between 2 µm and 8 µm.

16. The transistor device structure of claim 13, wherein the transistor die comprises:
a channel layer on the substrate;
a barrier layer on the channel layer;
a via that penetrates the substrate, the channel layer, and the barrier layer,
wherein a first portion of the metal bonding layer is between the substrate and the submount, and
wherein a second portion of the metal bonding layer is on a sidewall of the via.

17. The transistor device structure of claim 16, wherein the second portion of the metal bonding layer comprises greater amounts of unreacted nickel or tin than the first portion of the metal bonding layer.

18. The transistor device structure of claim 13, wherein the longest dimension of the metal bonding layer is between 4 mm and 10 mm along the surface.

19. A transistor device structure, comprising:
a transistor die comprising a semiconductor structure including a semiconductor substrate, a barrier layer and a channel layer;
a source contact on the semiconductor structure;
a via penetrating the semiconductor substrate, the barrier layer, and the channel layer to be electrically coupled to the source contact;
a metal bonding layer comprising a first portion and a second portion; and
a submount on the metal bonding layer,
wherein the metal bonding layer comprises an alloy of tin and nickel, and a weight percentage of a combination of nickel and tin in the metal bonding layer is greater than about 50 percent, and wherein the second portion of the metal bonding layer comprises a greater amount of unreacted nickel or tin than the first portion.

20. The transistor device structure of claim 19, wherein the metal bonding layer further comprises gold, and a weight percentage of gold in the metal bonding layer is less than about 25 percent.

21. The transistor device structure of claim 19, wherein the second portion of the metal bonding layer is within the via and the first portion of the metal bonding layer is outside the via and comprises a longest dimension of about 4 mm to 10 mm between the semiconductor substrate and the submount.

22. The transistor device structure of claim 19, wherein the first portion of the metal bonding layer is disposed at a same level as a portion of the channel layer.

23. The transistor device structure of claim 19, wherein the metal bonding layer further comprises a metal barrier layer between a tin portion of the metal bonding layer and the transistor die.

* * * * *